(12) United States Patent
Kincade et al.

(10) Patent No.: US 11,372,033 B1
(45) Date of Patent: Jun. 28, 2022

(54) ELECTRIC POWER MONITORING SYSTEM

(71) Applicant: Alarm.com Incorporated, Tysons, VA (US)

(72) Inventors: Kameron Kincade, Tysons, VA (US); Paul McNamee, Tysons, VA (US)

(73) Assignee: Alarm.com Incorporated, Tysons, VA (US)

( * ) Notice: Subject to any disclaimer, the term of this patent is extended or adjusted under 35 U.S.C. 154(b) by 386 days.

(21) Appl. No.: 16/407,369

(22) Filed: May 9, 2019

Related U.S. Application Data

(60) Provisional application No. 62/668,978, filed on May 9, 2018.

(51) Int. Cl.
*G06F 11/00* (2006.01)
*G01R 21/133* (2006.01)
*G01D 4/00* (2006.01)
*G08C 17/02* (2006.01)

(52) U.S. Cl.
CPC ........... *G01R 21/133* (2013.01); *G01D 4/004* (2013.01); *G01D 4/008* (2013.01); *G08C 17/02* (2013.01); *H02J 2310/64* (2020.01)

(58) Field of Classification Search
CPC ...... G01R 21/133; G01D 4/004; G01D 4/008; G08C 17/02; H02J 2310/64
USPC .................................................. 702/188
See application file for complete search history.

(56) References Cited

U.S. PATENT DOCUMENTS

| | | | |
|---|---|---|---|
| 4,644,320 A | 2/1987 | Carr et al. | |
| 5,543,778 A * | 8/1996 | Stouffer | G08B 25/10 340/425.5 |
| 6,297,746 B1 * | 10/2001 | Nakazawa | G08C 17/02 340/505 |
| 8,090,480 B2 | 1/2012 | Brumfield et al. | |
| 8,937,659 B1 * | 1/2015 | Scalisi | G08B 3/10 348/143 |
| 2007/0035389 A1 * | 2/2007 | Komiya | G08B 25/008 340/516 |
| 2007/0190813 A1 | 8/2007 | Okada et al. | |
| 2011/0209136 A1 * | 8/2011 | Sims | G06F 8/65 717/171 |
| 2014/0236372 A1 | 8/2014 | Ewing et al. | |
| 2014/0361870 A1 * | 12/2014 | Catalfamo | G08B 15/007 340/5.31 |
| 2014/0375144 A1 * | 12/2014 | Thorpe | F23N 5/242 307/129 |
| 2016/0063854 A1 * | 3/2016 | Burton | G08C 17/02 340/12.5 |

(Continued)

*Primary Examiner* — Naomi J Small
(74) *Attorney, Agent, or Firm* — Fish & Richardson P.C.

(57) ABSTRACT

A monitoring system that is configured to monitor a property is disclosed. The monitoring system includes a sensor that is configured to generate sensor data that reflects an attribute of the property. The monitoring system further include an electrical circuit that is located electrically between a power source and an electrical device and that is configured to pass electrical power from the power source to the electrical device or prevent electrical power from passing from the power source to the electrical device. The monitoring system further includes a monitor control unit that is configured to receive the sensor data, analyze the sensor data, and based on analyzing the sensor data, switch the electrical circuit to passing electrical power or to preventing electrical power from passing.

18 Claims, 4 Drawing Sheets

(56) References Cited

U.S. PATENT DOCUMENTS

| | | | |
|---|---|---|---|
| 2016/0334082 A1* | 11/2016 | Chen | H04N 5/2252 |
| 2017/0256941 A1 | 9/2017 | Bowers et al. | |
| 2018/0034657 A1* | 2/2018 | Brown | G06Q 10/06 |
| 2018/0102044 A1* | 4/2018 | Lamb | G08B 25/008 |
| 2019/0035244 A1* | 1/2019 | Garg | G08B 13/2491 |
| 2019/0063140 A1* | 2/2019 | Trundle | G07C 9/00896 |

* cited by examiner

ELECTRIC POWER MONITORING SYSTEM

CROSS-REFERENCE TO RELATED APPLICATION

This application claims the benefit of U.S. Application No. 62/668,978, filed May 9, 2018, which is incorporated by reference in its entirety.

TECHNICAL FIELD

This specification generally relates to monitoring systems.

BACKGROUND

Homes and other properties are typically equipped with electric power distribution systems that include circuits, breakers, and outlets for providing power to appliances, equipment, and other devices located throughout the property.

SUMMARY

Delivery of electric power from a generating station to an end user can generally be partitioned into two stages: a primary distribution stage, where electricity is transmitted from a generating station to an individual property, often through an electric power grid, and a secondary distribution stage, where the mains power provided by the generating station is distributed to different locations at the property through a network of secondary circuits. In many systems, different secondary circuits of the property power distribution system deliver electric power to different locations at the property. For example, a home may have one circuit that delivers electric power to a kitchen, a second circuit that delivers power to several bedrooms, and a third circuit that delivers electric power to a utility room. To improve safety, reduce cost, and limit the impact of power interruptions, property power distribution systems often use parallel network configurations, where circuits branch in parallel from the mains power input. For example, in a parallel circuit network, a homeowner can interrupt power to a circuit serving electrical appliances in one room of a home, while the circuits serving other rooms of the home remain powered. The ability to selectively interrupt power delivery to one or more circuits can be useful, for instance, when performing maintenance, remodeling, or other service operations in one region of the property without disrupting power delivery to another region of the property.

In a typical residential electric power distribution system, the electric power transmitted from the generating station is distributed to different secondary circuits at an electrical panel (e.g., a distribution board, breaker panel, breaker box). The electrical panel distributes electrical current to the various circuits, each of which may deliver power to multiple electrical receptacles, appliances, or output terminals. Generally, each circuit includes at least one circuit breaker, which is a switch that can be toggled to allow power delivery along the circuit (e.g., when the breaker is closed) or to interrupt power delivery (e.g., when the breaker is open). The circuit breakers are often accessible to a user via the electrical panel (e.g., as a switch within the electrical panel).

In some cases, a user may wish to remotely monitor and control the electric power distribution for their property. This disclosure describes systems, methods, and techniques for monitoring and controlling electric power distribution to a property using a property monitoring system. By integrating an electrical panel with a property monitoring system, a user can remotely monitor and control the status of various circuits distributing power to the property, providing for increased convenience, safety, and security of the user and the property. For example, by communicating with the monitoring system through a mobile device (e.g., a smart phone), a user can change the state of a breaker without being physically present at the electrical panel. Here, a user can interrupt, and later resume, power delivery to a particular circuit to perform a repair without having to travel between the location of the circuit and the location of the electrical panel. If the panel includes electric current, voltage, or power sensors, the user can further remotely monitor power consumption of the one or more circuits, providing the user a convenient means for identifying power usage patterns.

In some implementations, the system can monitor conditions on the property to identify potentially hazardous events and control electrical distribution accordingly. For example, the system may detect smoke or water in a particular room of a home. To prevent further damage that might occur were the smoke or water to reach a live electrical line, the system can instruct the electrical panel to open the breaker, and thus interrupt power delivery, for the circuit supplying power to the particular room. In another example, the system may detect that a particular circuit is not powered, even though the corresponding breaker for the circuit is closed. In this case, the system may determine that there has been a power outage and activate a back-up generator to temporarily resume power delivery to the circuit.

According to an innovative aspect of the subject matter described in this application, a monitoring system is configured to monitor a property. The monitoring system includes a sensor that is configured to generate sensor data that reflects an attribute of the property; an electrical circuit that is located electrically between a power source and an electrical device and that is configured to pass electrical power from the power source to the electrical device or prevent electrical power from passing from the power source to the electrical device; and a monitor control unit that is configured to: receive the sensor data; analyze the sensor data; based on analyzing the sensor data, determine to (i) switch the electrical circuit from passing electrical power from the power source to the electrical device to preventing electrical power from passing from the power source to the electrical device or (ii) switch the electrical circuit from preventing electrical power from passing from the power source to the electrical device to passing electrical power from the power source to the electrical device; and, based on determining to (i) switch the electrical circuit from passing electrical power from the power source to the electrical device to preventing electrical power from passing from the power source to the electrical device or (ii) switch the electrical circuit from preventing electrical power from passing from the power source to the electrical device to passing electrical power from the power source to the electrical device, switch the electrical circuit from passing electrical power from the power source to the electrical device to preventing electrical power from passing from the power source to the electrical device or switch the electrical circuit from preventing electrical power from passing from the power source to the electrical device to passing electrical power from the power source to the electrical device.

These and other implementations can each optionally include one or more of the following features. The monitor control unit is configured to determine an arming status of the monitoring system. The action of determining to (i)

switch the electrical circuit from passing electrical power from the power source to the electrical device to preventing electrical power from passing from the power source to the electrical device or (ii) switch the electrical circuit from preventing electrical power from passing from the power source to the electrical device to passing electrical power from the power source to the electrical device is based further on the arming status of the monitoring system.

The monitor control unit is configured to, based on analyzing the sensor data, determine that the monitor control unit received a command to switch the electrical circuit. The action of determining to (i) switch the electrical circuit from passing electrical power from the power source to the electrical device to preventing electrical power from passing from the power source to the electrical device or (ii) switch the electrical circuit from preventing electrical power from passing from the power source to the electrical device to passing electrical power from the power source to the electrical device is based further on the command to switch the electrical circuit.

The monitor control unit is configured to, based on analyzing the sensor data, generate a notification prompting a resident of the property whether to switch the electrical circuit; provide, for output, the notification prompting the resident whether to switch the electrical circuit; and receive, from the resident, a command to switch the electrical circuit. The action of determining to (i) switch the electrical circuit from passing electrical power from the power source to the electrical device to preventing electrical power from passing from the power source to the electrical device or (ii) switch the electrical circuit from preventing electrical power from passing from the power source to the electrical device to passing electrical power from the power source to the electrical device is based further on the command to switch the electrical circuit.

The monitor control unit is configured to, based on switching the electrical circuit from passing electrical power from the power source to the electrical device to preventing electrical power from passing from the power source to the electrical device or switch the electrical circuit from preventing electrical power from passing from the power source to the electrical device to passing electrical power from the power source to the electrical device, generate a notification indicating that the monitoring system switched the electrical circuit; and provide, for output, the notification indicating that the monitoring system switched the electrical circuit.

The monitor control unit is configured to determine to (i) switch the electrical circuit from passing electrical power from the power source to the electrical device to preventing electrical power from passing from the power source to the electrical device or (ii) switch the electrical circuit from preventing electrical power from passing from the power source to the electrical device to passing electrical power from the power source to the electrical device by determining to switch the electrical circuit from passing electrical power from the power source to the electrical device to preventing electrical power from passing from the power source to the electrical device; and, based on determining to switch the electrical circuit from passing electrical power from the power source to the electrical device to preventing electrical power from passing from the power source to the electrical device, switch the electrical circuit from passing electrical power from the power source to the electrical device to preventing electrical power from passing from the power source to the electrical device or switch the electrical circuit from preventing electrical power from passing from the power source to the electrical device to passing electrical power from the power source to the electrical device by switching the electrical circuit from passing electrical power from the power source to the electrical device to preventing electrical power from passing from the power source to the electrical device.

The sensor is a water sensor that is configured to generate water sensor data that reflects that water is present in a vicinity of the electrical device. The monitor control unit is configured to determine to switch the electrical circuit from passing electrical power from the power source to the electrical device to preventing electrical power from passing from the power source to the electrical device based on analyzing the water sensor data that reflects that water is present in the vicinity of the electrical device.

The sensor is a smoke detector that is configured to generate smoke detector data that reflects that smoke is present in a vicinity of the electrical device. The monitor control unit is configured to determine to switch the electrical circuit from passing electrical power from the power source to the electrical device to preventing electrical power from passing from the power source to the electrical device based on analyzing the smoke detector data that reflects that smoke is present in the vicinity of the electrical device.

The monitor control unit is configured to determine to (i) switch the electrical circuit from passing electrical power from the power source to the electrical device to preventing electrical power from passing from the power source to the electrical device or (ii) switch the electrical circuit from preventing electrical power from passing from the power source to the electrical device to passing electrical power from the power source to the electrical device by determining to switch the electrical circuit from preventing electrical power from passing from the power source to the electrical device to passing electrical power from the power source to the electrical device; and, based on determining to switch the electrical circuit from preventing electrical power from passing from the power source to the electrical device to passing electrical power from the power source to the electrical device, switch the electrical circuit from passing electrical power from the power source to the electrical device to preventing electrical power from passing from the power source to the electrical device or switch the electrical circuit from preventing electrical power from passing from the power source to the electrical device to passing electrical power from the power source to the electrical device by switching the electrical circuit from preventing electrical power from passing from the power source to the electrical device to passing electrical power from the power source to the electrical device.

The electrical device is a light. The monitor control unit is configured to, based on analyzing the sensor data, determine that a resident of the property is likely not at the property and that motion is detected inside the property; and determine to switch the electrical circuit from preventing electrical power from passing from the power source to the electrical device to passing electrical power from the power source to the electrical device based on determining that a resident of the property is likely not at the property and that motion is detected inside the property.

Other implementations of this aspect include corresponding systems, apparatus, and computer programs recorded on computer storage devices, each configured to perform the operations of the methods.

The details of one or more implementations of the subject matter described in this specification are set forth in the accompanying drawings and the description below. Other

BRIEF DESCRIPTION OF THE DRAWINGS

Like reference numbers and designations in the various drawings indicate like elements.

DETAILED DESCRIPTION

Figure 1:
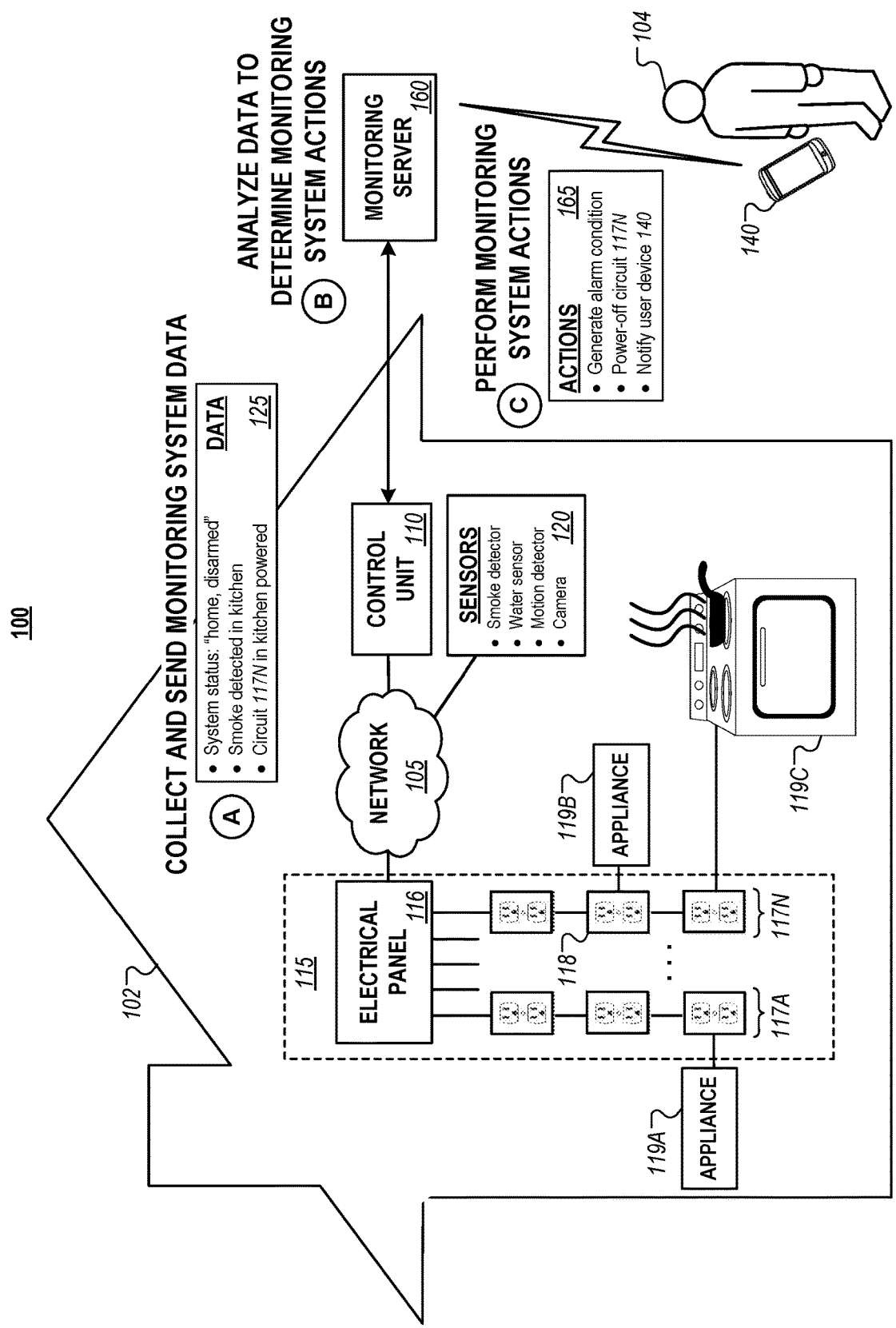
FIG. 1 is a diagram illustrating an example of a system for monitoring and controlling electric power distribution using a property monitoring system.

FIG. 1 is a diagram illustrating an example of a system 100 for monitoring and controlling electric power distribution using a property monitoring system. In the system 100, electric power is provided to various areas of a property 102 through an electric power distribution system 115. The distribution system 115 includes an electrical panel 116, which is connected to one or more circuits 117A-N. The property 102 is also equipped with a property monitoring system that includes a control unit 110, as well as one or more sensors 120, for monitoring the security and safety of the property 102. In system 100, the property monitoring system monitors and controls the electric power distribution system 115 by communicating with the electrical panel 116 or with other components of the distribution system 115. By communicating with the panel 116 or other distribution system components, the monitoring system, or a user 104 of the monitoring system, can determine the status of one or more components of the distribution system 115 (e.g., whether a particular circuit 117A-N is powered), change the status of one or more components of the system 115 (e.g., interrupt or resume power distribution along a particular circuit 117A-N), track electric power usage, and/or perform other operations related to the distribution system 115. One example of monitoring and controlling electric power distribution using a property monitoring system is depicted in steps (A) through (C), which represent a flow of data.

In more detail, the system 100 includes the property 102, which can be, for example a residence, a commercial building, or another facility. Electric power is distributed throughout various regions of the property 102 through the electric power distribution system 115, which includes an electrical panel 116, as well as one or more circuits 117A-N for delivering electricity to different physical locations of the property 102.

Typically, electric power may be generated at a generating station and delivered to the property 102 according to any of various standards (e.g., 60 Hz AC, 50 Hz AC, single-phase, three-phase, 120 volts, 240 volts, etc.). The mains electricity delivered to the property 102 can be routed to the electrical panel 116, where it is then distributed to one or more circuits 117A-N. The panel 116 can include various electrical equipment for monitoring and controlling electric current flow along the one or more circuits 117A-N. For example, the panel 116 can include a circuit breaker for each of the circuits 117A-N, where the breaker is an electrical switch that allows current to flow along the corresponding circuit 117A-N when the breaker is closed, but that prevents current flow, and thus power distribution, when it is opened. The circuit breakers can be operated manually (e.g., physically opened or closed by the user 108 or a computer system). The breakers can also be configured to automatically open (e.g., to interrupt current flow to the circuit) if a fault or overload condition is detected along the circuit. The breakers can be any of various configurations, including single-pole, double-pole, or other configuration. In some implementations, the breakers can be remote-controlled, such that a breaker's state can be changed by receiving an electronic control signal. The panel 116 can also include various other hardware and software for monitoring and controlling electric power flow through the circuits 117A-N, including voltage, current, and power sensors; fuses; and other components for selectively powering, controlling, or monitoring one or more of the circuits 117A-N.

The circuits 117A-N receive electric power from the mains power supply at the electrical panel 116 and route electrical current to various locations on the property 102. In some implementations, the circuits 117A-N are configured in a parallel network, with each circuit 117A-N providing power to a different physical region of the property 102. For example, one circuit 117A may provide power to a bedroom of the property 102, while another circuit 117N provides power to a kitchen of the property 102. Each circuit 117A-N can connect to one or more receptacles 118 or other terminals, outlets, or sockets that are configured to provide power to appliances, equipment, or other electronic devices. The receptacles 118 can be any of various configurations or standards. For example, the receptacles 118 can be two or three prong NEMA-standard sockets. The receptacles 118 provide power to one or more appliances 119A-C, or other electronic equipment or devices, by connecting to a plug or other power terminal of the appliance 119A-C.

In some implementations, one or more of the receptacles 118 can be smart receptacles. The smart receptacles 118 can include electronic hardware and/or software that provide functionality beyond basic power transmission. For example, a smart receptacle 118 can include a transmitter and/or receiver that allows it to communicate with other electronic devices (e.g., with other receptacles 118, with the electrical panel 116, or with another computer system). The smart receptacle 118 can also include an electronically-controlled internal switch, which can disable power flow through the outlet. The smart receptacle 118 can include a display, for example, one or more LEDs or screens, that indicate information related to receptacle to the user 104. For example, in some implementations, the LED or display can indicate whether the receptacle is powered and/or indicate a number, or other information, identifying the circuit 117A-N to which the receptacle is connected.

In some implementations, one or more of the receptacles 118 are controlled by one or more physical switches that can be toggled by a user 104 to control power flow through the receptacle 118. The switches can also include various electronics for control, communication, and/or display.

In system 100, the property 102 is equipped with a property monitoring system. For example, the monitoring system may be installed to monitor activity or conditions of the property, detect unsafe or insecure conditions, alert the user 104 or another entity to detected activities or events, or automate various devices of the property 102 for the convenience, safety, or security of the user 104.

The monitoring system includes one or more sensors 120 located throughout the property 102 that collect sensor data related to the property 102. For example, the sensors 120 can include smoke detectors, water sensors, motion detectors, or cameras that detect and record data related to activity or conditions on the property 102. The sensors 120 can also include door or window lock sensors, temperature sensors, or other sensors that provide information related to a state or condition of the property 102.

The sensors 120 communicate with a control unit 110, which can be, for example, a computer system located at the property 102. The control unit 110 is configured to exchange data with the sensors 120 and to perform various actions and operations for controlling the functionality of the monitoring system components located at the property 102.

In some implementations, the user 104 can communicate with the control unit 110 through a physical connection (e.g., through a touch screen or keypad on a control panel) and/or through a network connection. For example, in some implementations, the user 104 can set an alarm status of the system (e.g., "home, armed," "home, disarmed," "away, armed," "away, disarmed"), which the control unit 110 can use to determine various actions of the monitoring system.

In system 100, the sensors 120 communicate with the control unit 110 through a network 105. The network 105 can be any communication infrastructure that supports the electronic exchange of data between the control unit 110 and the one or more sensors 120. For example, the network 105 may include a local area network (LAN). The network 105 can be any combination of wired and/or wireless networks, and can include any one or more of Ethernet, Bluetooth, Bluetooth LE, Z-wave, Zigbee, or Wi-Fi technologies. In some cases, all or part of the network 105 is implemented as a mesh communications network.

The sensors 120 send various sensor data to the control unit 110. For example, a smoke detector may send data indicating that smoke has been detected in a particular room of the property 102, while a water sensor may send data indicating that water (e.g., flooding) has been detected in a particular region of the property 102. Similarly, a motion detector may send data indicating that movement has been detected. A camera may send still or video images of a portion of the property 102. A microphone may send audio data recorded in a region of the property 102. The control unit 110 can process the received sensor data to determine and perform various monitoring functions. For example, if smoke is sensed by a smoke detector in a particular room of the property 102, the control unit 110 may activate a sprinkler in the room.

The control unit 110 can also communicate with an authorized user device 140 of the user 104. The user device 140 can be, for example, a mobile phone, a smart phone, a tablet computer, a smart watch, or another mobile computing device. The user device 140 can also be a personal computer, a laptop computer, a smart speaker, an electronic home assistant, or another computing device. In some examples, the user device 140 can be a robotic device. In some implementations, the control unit 110 and/or the server 160 communicates with the user device 140 through network 105 (e.g., via Wi-Fi or other local wireless protocol).

The user device 140 can execute one or more software applications that enable it to communicate with the control unit 110. For example, through the software application, the user device 140 can receive notifications or alerts from the system and/or send commands to the system to control various system actions or operations.

To interface with the electric power distribution system 115, the control unit 110 also communicates with the electrical panel 116, for example, through the network 105. In some implementations, the electrical panel 116 includes electronic components (e.g., a transmitter, a receiver, a transceiver) that enables it to communicate with the control unit 110 through the network 105 or through another wired and/or wireless connection. For example, the electrical panel 116 may exchange data with the control unit 110 through Z-wave or other low-energy wireless protocol. In some implementations, the control unit 110 and/or the electrical panel 116 may also be able to exchange data with one or more smart receptacles 118 (e.g., over a wired or wireless network), if those receptacles 118 include hardware and software configured for data communication.

By communicating with the electrical panel 116, the control unit 110 can sense and monitor various aspects of the electric power distribution system 115. For example, the control unit 110 can sense and monitor the status of each breaker for the circuit 117A-N to determine the breaker type (e.g., single vs. double pole), the breaker status (e.g., open or closed), and/or whether the corresponding circuit 117A-N is powered (e.g., whether the breaker for the circuit is open or closed). In some implementations, the control unit 110 can sense the electrical properties of a particular circuit 117A-N, for example, the current amperage supplied to the circuit, the load of the circuit, the power consumed by the circuit. In some cases, the control unit 110 can process data related to the electrical properties of the circuit to analyze the electric power usage of the circuit and/or to identify one or more appliances 119A-C or devices connected to the circuit based on the analyzed power usage.

The control unit 110 can also change the state of one or more breakers of the electrical panel 116 (e.g., to interrupt or resume power delivery to the particular circuit 117A-N corresponding to the breaker). For example, the control unit 110 can send an electronic signal to a remote-controlled breaker to change the breaker's state. In some situations, it may be desirable to selectively interrupt power flow through a particular circuit 117N while maintaining power flow through the other circuits. For instance, if the electrical system in the kitchen the property 102 requires repair or service, the user 104 may want to stop current flow through the circuit 117N that provides power to the receptacles 118 in the kitchen to safely allow for the repair to be completed. However, the user 104 may want to continue delivering electricity to other rooms of the property 102 during the repair to limit disruption to other occupants of the property 102. To selectively interrupt power flow through the circuit 117N during the repair, the control unit 110 can open the breaker for the circuit 117N while leaving breakers for the other circuits closed.

In some implementations, the control unit 110 can also change the state of one or more remote-controlled switches of the electrical distribution system 115. For example, the control unit 110 can toggle a remote-controlled switch that enables or disables power flow through a single receptacle 118 or terminal, through multiple receptacles 118 or terminals, or through all receptacles of a particular circuit 117A-N.

In some implementations, the user 104 can monitor and/or control components of the electric power distribution system 115 through the user device 140. For example, the user device 140 can communicate with the electric panel 116 directly, through the network 105, or through the control unit 110. Through a display of the user device 140, the user 104 can view monitoring data related to the status of the circuits 117A-N or the circuit breakers, the sensed voltage level, current draw, or power consumption of one or more of the circuits 117A-N, or other electrical data related to the distribution system 115.

The user 104 may also remotely control the state of one or more of the circuit breakers in the panel 116 by sending the panel 116 a command through the user device 140. For example, in some implementations, the user 104 can provide input to the user device 140 indicating that the breaker for a particular circuit 117A should be opened to interrupt power delivery to the circuit. The user device 140 can send an instruction to open the breaker to the electrical panel 116 via the network 105 and the panel 116 can then open the indicated breaker. In some implementations, the user device 140 may send the instruction to the control unit 110, which then sends a command to the electrical panel 116 to open the indicated breaker.

In some implementations, the control unit 110 may be configured to map the circuits 117A-N of the property 102. As noted previously, each circuit 117A-N may connect to multiple receptacles 118 or other power terminals. Currently, detecting those receptacles 118 connected to a particular circuit 117A can be a labor-intensive process, in which the user 104 typically must physically power-off a circuit 117A by manually switching the breaker for the circuit 117A at the electrical panel 116. The user 104, then physically goes to the location of each receptacle 118 to determine whether the receptacle 118 is powered. The user 104 can then determine that those receptacles 118 that are not powered are connected to the circuit 117A that has been powered-off. Typically, the user 104 must repeat this process for each circuit 117A-N and each receptacle 118 that he wants to map.

In the disclosed system, the control unit 110 may be configured to identify those receptacles 118 that are connected to a particular circuit 117A-N autonomously or semi-autonomously. For example, if the receptacles 118 are smart receptacles that can sense whether the receptacle 118 is powered, the control unit 110 can open and close each breaker in sequence, such that only one breaker is open (and thus power is only interrupted to one circuit 117A) at a given time. When the breaker for a particular circuit 117A is open, the control unit 110 can communicate with the smart receptacles 118 to identify those receptacles 118 that are not powered. The control unit 110 can then associate those unpowered receptacles 118 with the circuit 117A whose breaker is currently open. The control unit 110 can then close the breaker, repowering the circuit 117A, and repeat the process for another breaker and circuit. In this way, the control unit 110 can map the power distribution system 115, determining those receptacles 118 connected to each circuit 117A-N. The control unit 110 can then store the mapping information for later use or display.

If the receptacles 118 are unable to sense and communicate their power state, the control unit 110 can map the circuits semi-autonomously, by cooperating with the user 104 using the user device 140. In this case, after opening a breaker to interrupt power to a particular circuit 117A, the control unit 110 receives information from the user device 140 identifying those receptacles 118 that are not powered. For example, while the breaker is open and the circuit 117A is powered-off, the user 104 may determine whether one or more receptacles 118 are powered, then indicate to the control unit 110 through an application running on the user device 140, those receptacles that are not powered and thus which are connected to the circuit 117A.

In some implementations, the system 100 uses data from the sensors 120, information from the distribution system 115, or other monitoring system data to determine and perform one or more actions. For example, the control unit 110 can also communicate with a monitoring server 160. The server 160 can be one or more computer or server systems that process, analyze, and/or store data related to the property 102 received from the control unit 110. In some implementations, the server 160 is remote from the property 102 and the control unit 110 and server 160 communicate via a long-range data link. The long-range data link can include any combination of wired and wireless data networks. For example, the control unit 110 can exchange information with the server 160 through a wide-area-network (WAN), a cellular telephony network, a wireless data network, a cable connection, a digital subscriber line (DSL), a satellite connection, or other electronic means for data transmission. The control unit 110 and the server 160 may exchange information using any one or more of various communication synchronous or asynchronous protocols, including the 802.11 family of protocols, GSM, 3G, 4G, 5G, LTE, CDMA-based data exchange or other techniques.

In some implementations, the monitoring server 160 also communicates with the user device 140. For example, the server may exchange data with the device 140 through a cellular telephony or wireless data network.

The monitoring server 160 can be one or more computer systems, for example, a server system, that provides monitoring services for the property 102 by exchanging data with the control unit 110 and other components of the system. In some implementations, the server 160 stores and/or processes sensor data or other monitoring system data received from the control unit 110. To analyze and process the received data, the server 160 can implement any of various processing techniques. For instance, the server 160 can implement one or more machine learning models, neural networks, regression models, simulators, pattern recognition techniques, optimization models, predictive analytics, or other analysis techniques.

The server 160 can analyze the received data to determine one or more monitoring system actions. For example, the server 160 may analyze the data to detect one or more alarm conditions and perform one or more actions in response to the detected condition (e.g., send a command to sound an audible alarm, lock a door, turn on a light; notify emergency services; activate a recording device). In some examples, the server may analyze the received data to determine an activity pattern of an occupant of the property 102 and perform one or more actions in response to the detected activity pattern (e.g., change a thermostat setting, turn on an appliance).

The server 160 can also analyze the received data to determine an action related to the electric power distribution system 115. For example, the server can determine to change a state of a component of the electric power distribution system 115. Steps (A) through (C) of FIG. 1 depict an example where, based on (i) sensor data indicating there is smoke in the kitchen and (ii) data from the distribution system indicating that the circuit 117N that provides power to the kitchen is powered, the system performs actions 165, which include notifying the user device 140, generating an alarm condition, and interrupting the power to the circuit 117N.

In step (A), the control unit 110 of the monitoring system collects data 125 and sends the data 125 to the monitoring server 160. The data 125 can include sensor data from one or more sensors 120, as well as data related to the electric power distribution system 115. For example, the data 125 can include data collected by a smoke or water sensor, a motion detector, a camera, a microphone, a motion sensor, or other sensors 120 located on the property 102. The data 125 can include a status of one or more breakers of the distribution system 115 (e.g., open or closed), a status of one or more switches of the distribution system 115, a status of one or more circuits 117A-N (e.g., powered, not powered, overloaded), or other data related to the voltage level, current draw, power consumption, or load of one or more circuits 117A-N. The data 125 can also include other monitoring system data. For example, the data 125 can include a status of the monitoring system (e.g., "home, armed," "home, disarmed," "away, armed," "away, disarmed"), a status of one or more door or window locks, or other system data. In some implementations, the control unit 110 processes or analyzes some or all of the data 125. After collecting the data 125 and processing it if desired, the control unit 110 sends the data 125 to the server 160.

In the example of FIG. 1, the control unit 110 collects data indicating that the system status is "home, disarmed," indicating that the property 102 may be occupied by the user 104. The unit 110 also receives sensor data from a smoke detector 120 indicating that smoke is detected in the kitchen. The unit 110 also receives from the electrical panel 116 distribution system data indicating that the circuit 117N, which provides power to the kitchen, is currently powered (e.g., the breaker for circuit 117N is closed). This scenario could occur, for instance, if an untended pot on a stove 119C overheated or if a frayed power cord of a toaster in the kitchen began to emit smoke. The control unit 110 then sends the data 125 to the remote monitoring server 160.

In step (B), the monitoring server 160 analyzes the received data 125 and determines one or more actions 165 based on the analysis. For example, the server 160 can analyze the data 125 to determine whether one or more events are detected. A detected event may be, for instance, a power interruption on one or more of the circuits 117A-N, an alarm condition, a particular set of sensor data, or a particular user input to the user device 140 or the control unit 110.

In some implementations, the server 160 determines the actions 165 by applying one or more rules, where the rules indicate those actions that the server 160 should take if a particular event or set of events is detected. For example, the rules may indicate that the server 160 should send a notification to the user device 140 if it detects a power interruption on any of the circuits 117A-N. The rules can be predetermined and stored by the monitoring server 160, for example, in a memory system of the server 160. In some implementations, the rules can be set or modified by the user 104 (e.g., customizable rules). In some implementations, the server 160 can generate the rules by analyzing historical data from the property 102.

The actions 165 can be any of various actions performed by one or more components of the monitoring system or devices communicating with the monitoring system. The actions 165 can include sending a notification or message to the user device 140 and/or sending an instruction to the electrical panel 116. For example, the actions 165 can include sending an instruction to the electrical panel to open or close the breaker for a particular circuit 117A-N. The actions 165 can also include any of various other monitoring system actions, including sending an instruction to another device of the monitoring system (e.g., to the control unit 110, to a sensor 120), setting an alarm condition, sounding an audible alarm, or sending a message to a third-party (e.g., to emergency services, to security personnel).

In the example of FIG. 1, the server 160 analyzes the data 125 to determine that there is smoke in the kitchen of the property 102 and that the circuit 117N that provides power to the kitchen is delivering power. Based on these events and the rules associated with the events, the server 160 determines that it should perform the actions 165, which include notifying the user device 140 of the smoke, generating an alarm condition, and sending an instruction to the electrical panel 116 to interrupt power delivery to the circuit 117N. In this example, by interrupting power delivery to the kitchen, the system may be able to prevent an untended overheated pot on the stove 119C or a smoldering toaster power cord from igniting, mitigating further damage to the property 102.

In some implementations, the control unit 110 collects and sends data related to the power usage of various different appliances 119A-C connected to the electrical distribution system 115. The monitoring server 160 can then analyze the power usage data to detect a malfunction of an appliance 119A-C. For example, based on historical power usage data sent by the control unit 110, the server 160 may determine a typical power consumption for a particular appliance 119C. In some cases, the server 160 can determine that, when the measured power consumption for an appliance 119C deviates a threshold amount from the typical consumption (e.g., if the measured power consumption is significantly higher or lower than the typical consumption), the appliance 119C may be malfunctioning. The server 160 can then determine actions 165 that include interrupting power delivery to the circuit 117N or to the receptacle 118 or terminal that supplies power to the appliance 119C. In some instances, monitoring the power consumption of an appliance 119C can enable the system 100 to detect and mitigate potential electrical malfunctions before any significant property damage occurs.

In step (C), the server 160 performs the determined actions 165. In this example, the server 160 sends a notification to the user device 140, generates an alarm condition, and sends an instruction to the electrical panel 116, via the control unit 110, to open the breaker for circuit 117N that routes power to the kitchen. In some cases, the server 160 may send an instruction to a remote-controlled switch of the electrical distribution system 115 to disable power only to the receptacle 118 or terminal that powers the appliance 119C.

In some implementations, when the server 160 changes the state of a component of the electrical distribution system 115, it provides data related to the state of the component to the application running on the user device 140. For example, the server 160 can send data to the application that indicates that a particular circuit breaker has been opened. The application can update a display to indicate to the user 104 the current state of the various circuits, switches, or other electrical components of the electrical distribution system 115 of the property 102.

Various other actions 165 are also possible. For example, if an event is detected and the system status is "home, armed" or "home, disarmed," in addition to sending an instruction to the electrical distribution system 115, the server 160 may send an instruction to sound an audible alarm on the property 102 to warn any occupants of the event. If the system status is "away, armed" or "away, disarmed," rather than sounding an alarm, the server 160 may send a notification to the user device 140, or send a message to third-party (e.g., emergency services, security personnel). In some cases, the server 160 may deploy a mobile drone or robotic device to investigate the detected event. The server 160 can also activate one or more sensors 120 to obtain more information related to the event (e.g., activate a camera in the kitchen to capture images that may indicate the source of the smoke).

Though steps (B) and (C) are described above as being performed by the monitoring server 160, in some implementations, they may be performed by the control unit 110 or by another computing system located at or remote from the property 102.

Figure 2:
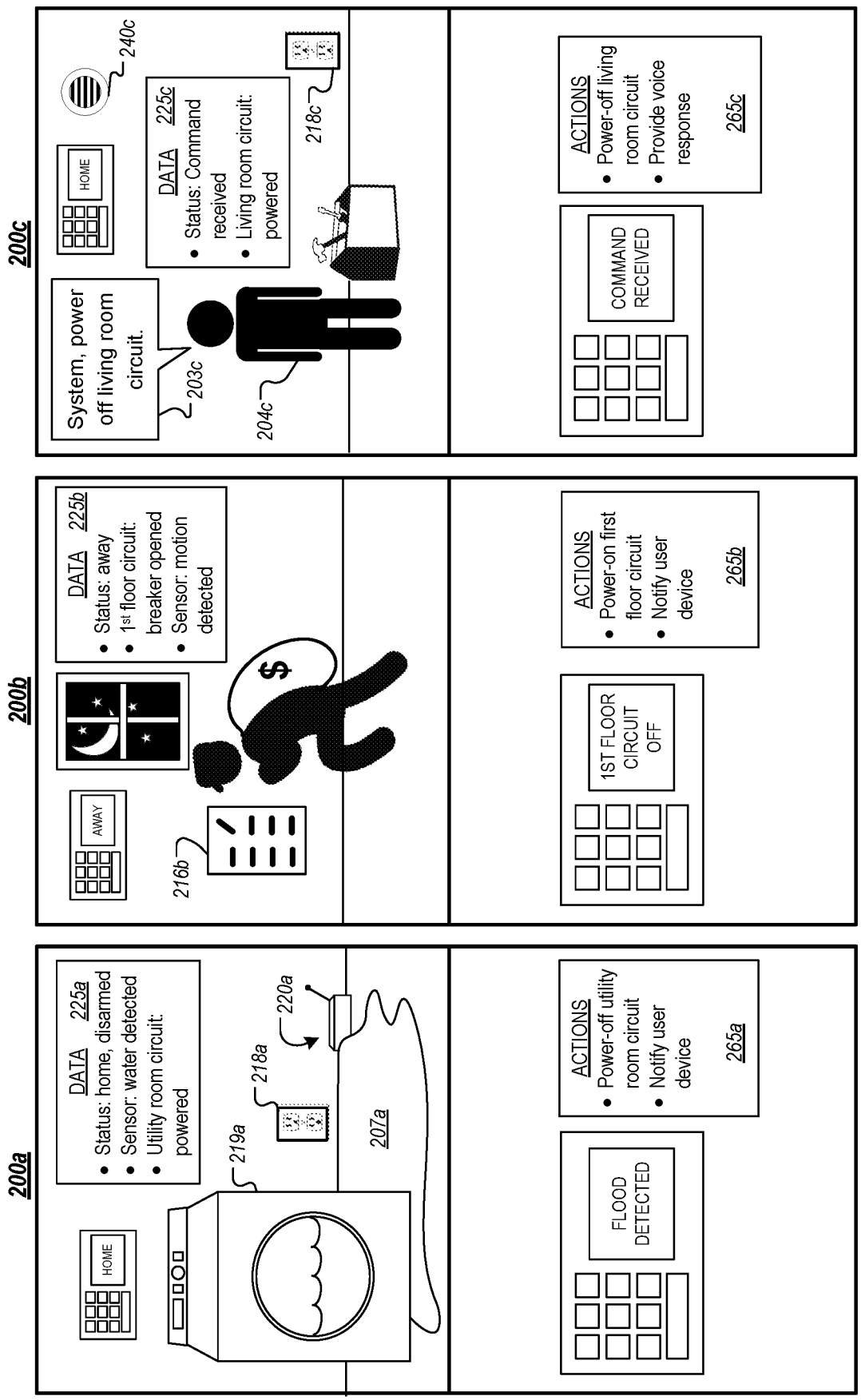
FIGS. 2A-2C are diagrams illustrating examples of monitoring and controlling electric power distribution using a property monitoring system.

FIGS. 2A, 2B, and 2C are diagrams illustrating additional examples 200a, 200b, and 200c, respectively, of monitoring and controlling electric power distribution using a property monitoring system. Examples 200a, 200b, and 200c can be implemented by a property monitoring system such as that included in system 100 of FIG. 1.

In FIG. 2A, an appliance 219a is a washing machine that is located in a utility room of a residence. The washing machine is powered by a circuit that supplies power to the entire utility room ("the utility room circuit"). Also powered by the utility room circuit is the receptacle 218a, which is located slightly above floor level in the utility room. Also located in the utility room is a water sensor 220a, which detects the presence of water on the utility room floor. The water sensor 220a communicates wirelessly with the control unit of the monitoring system. Here, the resident of the property has also set the system status to "home, disarmed," indicating that he is present at the property.

In the example 200a, the washing machine 219a has overflowed, spilling water 207a onto the floor of the utility room. The water 207a is detected by the water sensor 220a, which sends data indicating the presence of water in the utility room to the control unit. The control unit then sends data 225a to the monitoring server, where the data 225a includes the information indicating that the system status is "home, disarmed," the sensor data indicating that water has been detected in the utility room, and the electric power distribution system data indicating that the circuit feeding the receptacle 218a in the utility room is currently powered.

Based on analyzing the received data 225a, the monitoring server determines that a flood has been detected in the utility room. The server then performs the actions 265a, which include sending an instruction to the electrical panel to power-off the utility room circuit (e.g., by opening the breaker for the circuit) and sending a notification to the user device indicating the detected flood and powered-off circuit. By interrupting power to the utility room circuit, the system can prevent potential damage or fire that could occur were the water 207a to reach the receptacle 218a while the receptacle was still powered.

In the example 200b of FIG. 2B, the residents of the home are away and so have set the monitoring system status to "away, armed." While the residents are away, an intruder enters the home. In an effort to deactivate any monitoring system sensors on the first floor, the intruder turns off the power to the circuit supplying the first floor by opening the corresponding circuit breaker on the electrical panel 216b The control unit receives data indicating that the first floor circuit breaker has been opened. The control unit also receives data indicating that, before the breaker was opened, motion was detected on the first floor.

The control unit then sends data 225b to the monitoring server, where the data 225b includes the information indicating that the system status is "away, armed," the electric power distribution system data indicating that the first floor circuit breaker is open, and the sensor data indicating that motion was detected on the first floor prior to the power interruption. Based on analyzing the data 225b, the server determines that the first floor circuit is unpowered and that, based on the motion data, it may have been intentionally powered-off. The server then performs actions 265b, which include sending an instruction to the electrical panel to close the breaker (e.g., to restore power to the first floor circuit) and sending a notification to a user device.

In another example, the server may receive data 225b from the control unit indicating that one or more circuits are not powered, but that the breakers to those circuits are closed. (e.g., the power was not intentionally interrupted by opening the circuit breakers). In this case, the server may analyze the data to determine that there has been a power outage of the primary distribution system. Based on the determination, the server may then perform actions 265b, which include activating a back-up generator on the property to temporarily restore power to the circuits.

In the example 200c of FIG. 2C, a user 204c wants to interrupt power to the living room circuit so that he can perform a repair on the receptacle 218c, which is powered by the circuit. To interrupt power to the circuit, the user 204c speaks a voice command 203c to a smart speaker 240c instructing the system to power-off the living room circuit. The smart speaker 240c, which is an authorized device that communicates with the monitoring system, sends the command to the control unit. The control unit then sends data 225c to the monitoring server that includes data indicating the voice command, as well as data indicating that the living room circuit is currently powered. Based on analyzing the data 225c, the server performs the actions 265c, which include sending an instruction to the electrical panel to power-off the living room circuit by opening the living room circuit breaker and sending a command to the smart speaker 240c to provide a voice response to the user 204c indicating that the power to the circuit has been turned off. In some implementations, the control unit may perform the analysis and actions described above without communicating with a remote server.

Many other scenarios and applications are also included within the scope of this disclosure. For example, in some implementations, the monitoring system sensors may include an indoor air quality sensor that detects the presence of a gas (e.g., $CO_2$ or natural gas) at the property. Based on receiving sensor data indicating the presence of the gas, the monitoring server, or the control unit, may send an instruction to the electrical panel to interrupt power delivery to any appliances or circuits that could pose a fire risk in the presence of the gas. For instance, the control unit may send an instruction to interrupt power to the receptacle powering a stove or a clothes dryer if natural gas has been detected at the property.

In some implementations, the monitoring system sensors may include a fire detector or smoke alarm that determines there is a fire in a location at the property. Based on receiving sensor data indicating the fire, the monitoring server or the control unit may send an instruction to the electrical panel to interrupt power delivery to an HVAC system in order to limit the spread of fire by limiting air circulation.

In some implementations, the monitoring server and/or the control unit may receive weather data indicating a nearby weather event that may cause power loss to the property (e.g., a lighting storm, a hurricane, a tornado). For example, the monitoring server and/or the control unit may receive weather data from a nearby weather station, from the Internet (e.g., from a weather forecast service that transmits data via the Internet), or from an emergency broadcast service (e.g., a weather alert). If the server or control unit receives weather data detecting a weather even that may cause power loss, the server or control unit can send an instruction to the electrical panel to enable a back-up generator connected to the property's electric power distribution system. Enabling the back-up generator in advance of the power loss can protect appliances and equipment at the property from experiencing failure or other adverse effects arising from a sudden, unexpected power interruption due to a weather event.

In some implementations, the property serviced by the monitoring system and the electric power distribution system may be a multi-unit property (e.g., an apartment building or an office building). The property owner may be able to allow a particular user to access and control (e.g., enable or disable power delivery) a subset of the power distribution system, for instance, through an application running on the user's phone, while restricting the user's access to other parts of the distribution system. For example, the property owner may be able to allow a tenant to control the circuits that supply power to the tenant's unit, while restricting the tenant from controlling the circuits that supply power to the rest of the property. In some cases, the property owner can manage user access by communicating with the monitoring server or the control unit through the owner's computing device (e.g., by adjusting one or more settings in a software application running on the computing device).

Figure 3:
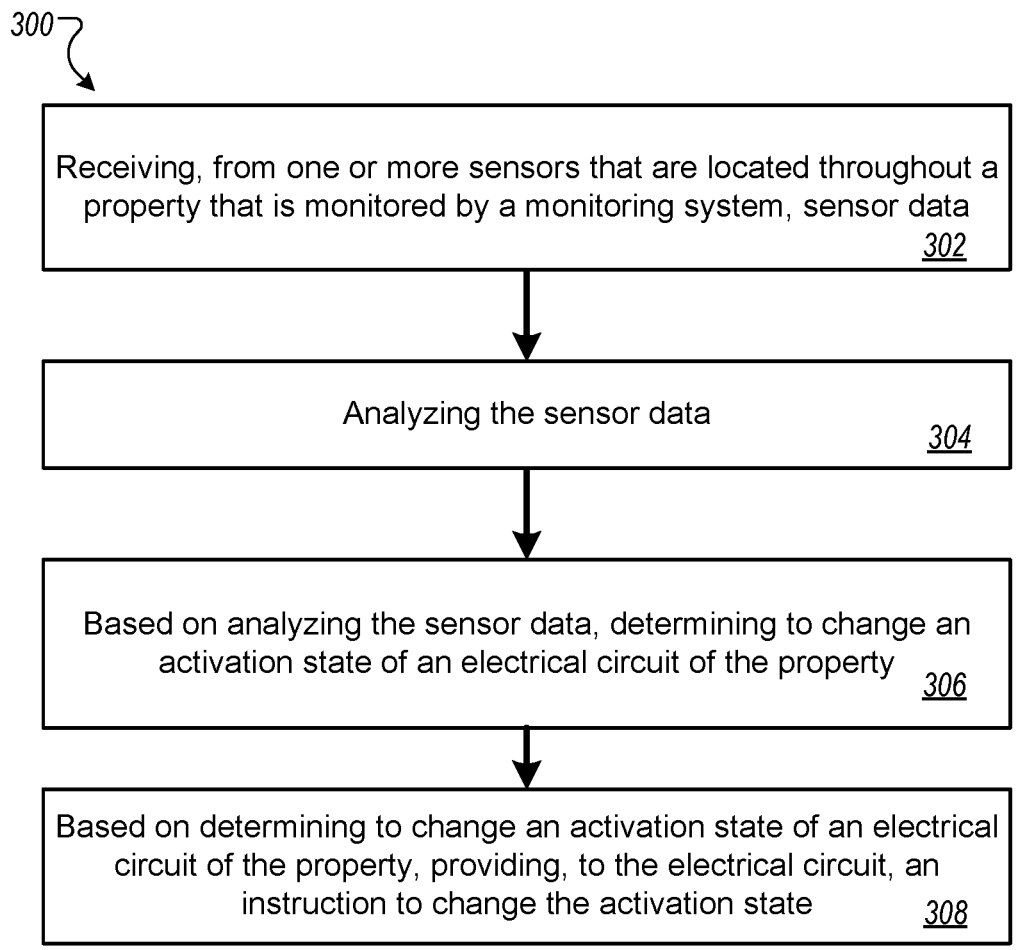
FIG. 3 is a flow chart illustrating an example method for monitoring and controlling electric power distribution using a property monitoring system.

FIG. 3 is a flow chart illustrating an example method 300 for monitoring and controlling electric power distribution using a property monitoring system. The method 300 can be performed by a computer or server system, such as the monitoring server 160 of system 100. Briefly, the method includes receiving, from one or more sensors that are located throughout a property that is monitored by a monitoring system, sensor data (302); analyzing the sensor data (304); based on analyzing the sensor data, determining to change an activation state of an electrical circuit of the property (306); and based on determining to change an activation state of an electrical circuit of the property, providing, to the electrical circuit, an instruction to change the activation state (308).

In more detail, in step 302, a server receives, from one or more sensors that are located throughout a property that is monitored by a monitoring system, sensor data. The sensors can include any of various sensors connected to the property monitoring system, such as cameras, motion detectors, water sensors, smoke detectors, indoor air quality detectors, other human presence detectors. The sensors can also include devices that monitor the status of one or more doors or windows of the home (e.g., a sensor that indicates whether a door or window is open, closed, locked or unlocked). The sensors may also include devices that are part of an electrical distribution system of the property. For example, the sensors can include devices that indicate a status of a particular component of the electrical distribution system (e.g., the status of a breaker, a switch, or a receptacle). The sensors can include devices that measure an electrical parameter related to particular circuit, receptacle, or appliance connected to the electrical distribution system. For example, the sensors can include devices that measure current, voltage, power consumption, or another electrical parameter.

In some implementations, a control unit at the property collects sensor data from one or more sensors and sends the data to the server. The sensor data can include data captured by monitoring system sensors, sensors of the electrical distribution system, or other sensors located throughout the monitored property. The sensor data can also include various data related to a status of the monitoring system (e.g., "home, armed," "home, disarmed," "away, armed," "away, disarmed"). In some implementations, the sensor data includes data from a user device. For example, the sensor data can include data related to a command input to a user's mobile device, or data related to a voice command received by an electronic home assistant, robot, or smart speaker.

In step 304, the server analyzes the sensor data. In some implementations, the server analyzes the data using one or more machine learning models, neural networks, regression models, simulators, pattern recognition techniques, optimization models, predictive analytics, or other analysis techniques. In some implementations, the server analyzes the sensor data to detect a condition of the property or an event at the property.

In step 306, based on analyzing the sensor data, the server determines to change an activation state of an electrical circuit of the property. For example, based on analyzing sensor data indicating that a user input a command to a mobile device to disable a particular circuit of the property, the server may determine that the circuit breaker associated with the particular circuit should be opened (e.g., switched off).

In some implementations, the server analyzes the sensor data to detect a condition of the property or an event at the property and determines to change an activation state of an electrical circuit of the property based on the condition or event detection. For example, based on the received sensor data, the server may determine that there is a flood or fire in a particular location of the property. Based on detecting the flood or fire, the server may determine that the one or more circuits that deliver power to the particular location of the property should be disabled (e.g., the breakers corresponding to the circuits should be changed from a closed to open state).

In some implementations, the server determines to change an activation state of an electrical circuit based on one or more rules. For example, the server can include a rules engine that stores predetermined, user-input, or server-generated rules indicating various actions corresponding to a particular detected property condition or event. Based on analyzing the received data and detecting a particular condition or event, the server can apply the rules to determine an appropriate action (e.g., to change an activation state of an electrical circuit or electric power distribution system component).

In some implementations, the server determines that the activation state of a breaker should be changed. In some implementations, the server determines that the state of another component of the electrical distribution system should be changed (e.g., the state of a switch, receptacle, or other component).

In some implementations, in addition to determining that the state of component of the electrical distribution system should be changed, the server also determines one or more additional actions. For example, the server can determine to send a notification to mobile device of a user or to send an alert to a third-part (e.g., emergency services, security personnel). The server can also determine to sound an alarm at the property, to activate another sensor of the property, or to deploy a mobile drone or robot to a particular location on the property. In some implementations, the server provides data related to the state of the component of the electrical distribution system to an application running on a user device. The application can then update a display to indicate the current status (e.g., on, off, open, closed, powered, power interrupted) of one or more components of the electrical distribution system.

In some implementations, the server analyzes the sensor data to determine a typical power consumption of an appliance at the property. In some instances, the server may determine that the received sensor data indicates that the power consumed by the appliance at a particular time deviates more than a threshold amount from the typical power consumption. Based on the determination, the server may determine that the appliance is malfunctioning and that power delivery to the appliance should be interrupted (e.g., by opening the breaker that corresponds to the circuit to which the appliance is connected, by opening a switch that controls power delivery to the receptacle or terminal to which the appliance is connected).

In step 308, based on determining to change an activation state of an electrical circuit of the property, the server provides, to the electrical circuit, an instruction to change the activation state. For example, the server can send an instruction to the control unit located at the property to direct a change in state of a component of the property's electrical distribution system. The server can also perform other determined actions, such as sending a message, instruction, or notification to a user device, sending updated status information to an application running on a user device, or sending an instruction to another device connected to the monitoring system.

While described above as being performed by a monitoring server, in some implementations, the method 300 can performed by the control unit of a property monitoring system (e.g., a control unit located at the property), or another computer system located at or remote to the monitored property.

Figure 4:
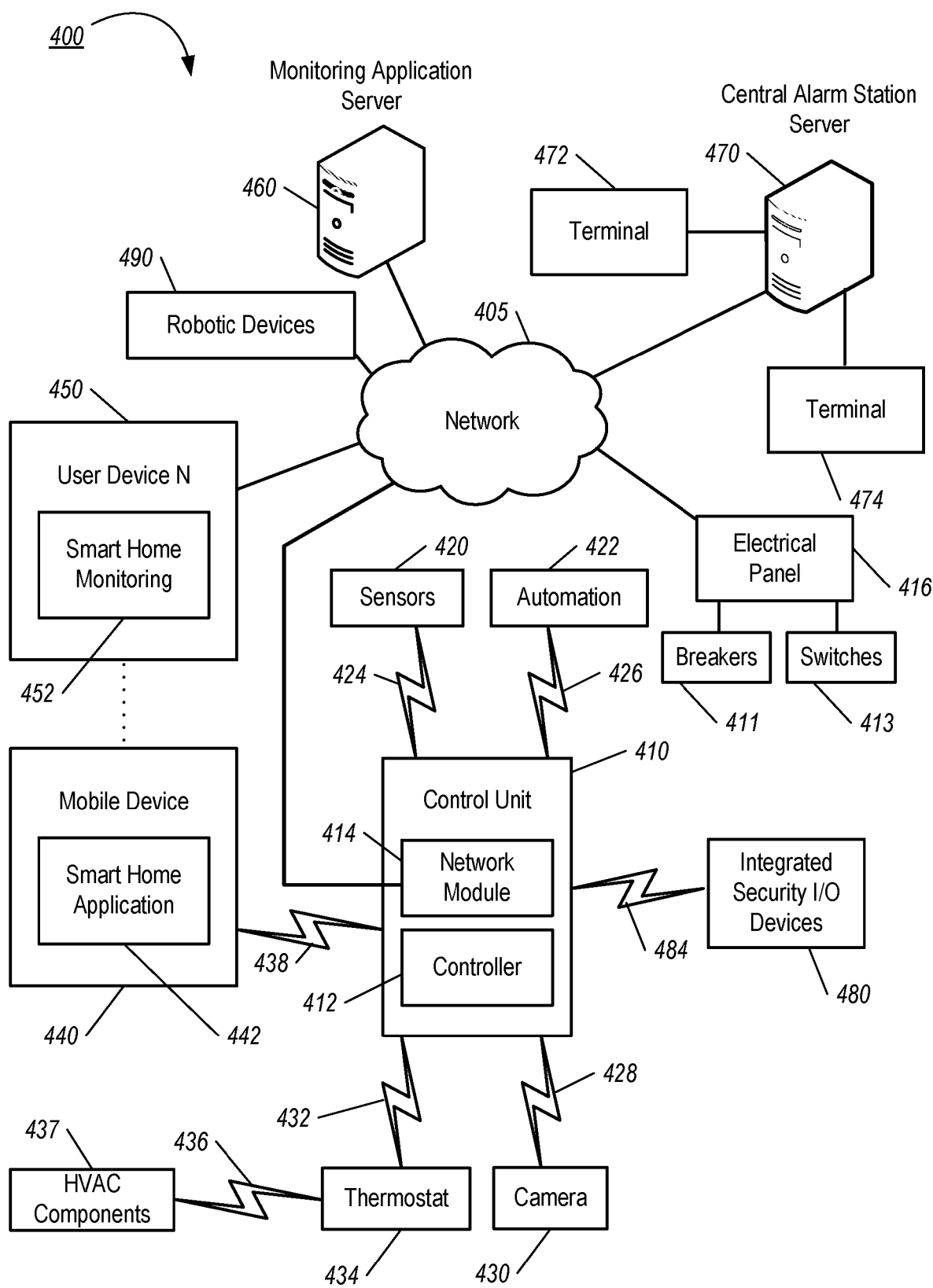
FIG. 4 is a diagram illustrating an example of a property monitoring system.

FIG. 4 is a diagram illustrating an example of a property monitoring system 400. The electronic system 400 includes a network 405, a control unit 410, an electric panel 416, one or more user devices 440 and 450, and a monitoring server 460. In some examples, the network 405 facilitates communications between the control unit 410, the electric panel 416, the one or more user devices 440 and 450, and the monitoring server 460.

The network 405 is configured to enable exchange of electronic communications between devices connected to the network 405. For example, the network 405 may be configured to enable exchange of electronic communications between the control unit 410, the electric panel 416, the one or more user devices 440 and 450, and the monitoring server 460. The network 405 may include, for example, one or more of the Internet, Wide Area Networks (WANs), Local Area Networks (LANs), analog or digital wired and wireless telephone networks (e.g., a public switched telephone network (PSTN), Integrated Services Digital Network (ISDN), a cellular network, and Digital Subscriber Line (DSL)), radio, television, cable, satellite, or any other delivery or tunneling mechanism for carrying data. The network 405 may include multiple networks or subnetworks, each of which may include, for example, a wired or wireless data pathway. The network 405 may include a circuit-switched network, a packet-switched data network, or any other network able to carry electronic communications (e.g., data or voice communications). For example, the network 405 may include networks based on the Internet protocol (IP), asynchronous transfer mode (ATM), the PSTN, packet-switched networks based on IP, X.25, or Frame Relay, or other comparable technologies and may support voice using, for example, VoIP, or other comparable protocols used for voice communications. The network 405 may include one or more networks that include wireless data channels and wireless voice channels. The network 405 may be a wireless network, a broadband network, or a combination of networks including a wireless network and a broadband network.

The control unit 410 includes a controller 412 and a network module 414. The controller 412 is configured to control a control unit monitoring system (e.g., a control unit system) that includes the control unit 410. In some examples, the controller 412 may include a processor or other control circuitry configured to execute instructions of a program that controls operation of a control unit system. In these examples, the controller 412 may be configured to receive input from sensors, flow meters, or other devices included in the control unit system and control operations of devices included in the household (e.g., speakers, lights, doors, etc.). For example, the controller 412 may be configured to control operation of the network module 414 included in the control unit 410.

The network module 414 is a communication device configured to exchange communications over the network 405. The network module 414 may be a wireless communication module configured to exchange wireless communications over the network 405. For example, the network module 414 may be a wireless communication device configured to exchange communications over a wireless data channel and a wireless voice channel. In this example, the network module 414 may transmit alarm data over a wireless data channel and establish a two-way voice communication session over a wireless voice channel. The wireless communication device may include one or more of a LTE module, a GSM module, a radio modem, cellular transmission module, or any type of module configured to exchange communications in one of the following formats: LTE, GSM or GPRS, CDMA, EDGE or EGPRS, EV-DO or EVDO, UMTS, or IP.

The network module 414 also may be a wired communication module configured to exchange communications over the network 405 using a wired connection. For instance, the network module 414 may be a modem, a network interface card, or another type of network interface device. The network module 414 may be an Ethernet network card configured to enable the control unit 410 to communicate over a local area network and/or the Internet. The network module 414 also may be a voice band modem configured to enable the alarm panel to communicate over the telephone lines of Plain Old Telephone Systems (POTS).

The control unit system that includes the control unit 410 includes one or more sensors. For example, the monitoring system may include multiple sensors 420. The sensors 420 may include a lock sensor, a contact sensor, a motion sensor, or any other type of sensor included in a control unit system. The sensors 420 also may include an environmental sensor, such as a temperature sensor, a water sensor, a rain sensor, a wind sensor, a light sensor, a smoke detector, a carbon monoxide detector, an air quality sensor, etc. The sensors 420 further may include a health monitoring sensor, such as a prescription bottle sensor that monitors taking of prescriptions, a blood pressure sensor, a blood sugar sensor, a bed mat configured to sense presence of liquid (e.g., bodily fluids) on the bed mat, etc. In some examples, the sensors 420 may include a radio-frequency identification (RFID) sensor that identifies a particular article that includes a pre-assigned RFID tag.

The control unit 410 can also communicate with one or more property automation controls 422 and the sensors 420, which can include one or more cameras 430, to perform monitoring. The property automation controls 422 are connected to one or more devices that enable automation of actions at the property. For instance, the property automation controls 422 may be connected to one or more lighting systems and may be configured to control operation of the one or more lighting systems. Also, the property automation controls 422 may be connected to one or more electronic locks at the property and may be configured to control operation of the one or more electronic locks (e.g., control Z-Wave locks using wireless communications in the Z-Wave protocol). Furthermore, the property automation controls 422 may be connected to one or more appliances at the property and may be configured to control operation of the one or more appliances. The property automation controls 422 may include multiple modules that are each specific to the type of device being controlled in an automated manner. The property automation controls 422 may control the one or more devices based on commands received from the control unit 410. For instance, the property automation controls 422 may cause a lighting system to illuminate an area to provide a better image of the area when captured by a camera 430.

The camera 430 may be a video/photographic camera or other type of optical sensing device configured to capture images. For instance, the camera 430 may be configured to capture images of an area within a building or property 102 monitored by the control unit 410. The camera 430 may be configured to capture single, static images of the area and also video images of the area in which multiple images of the area are captured at a relatively high frequency (e.g., thirty images per second). The camera 430 may be controlled based on commands received from the control unit 410.

The camera 430 may be triggered by several different types of techniques. For instance, a Passive Infra-Red (PIR) motion sensor may be built into the camera 430 and used to trigger the camera 430 to capture one or more images when motion is detected. The camera 430 also may include a microwave motion sensor built into the camera and used to trigger the camera 430 to capture one or more images when motion is detected. The camera 430 may have a "normally open" or "normally closed" digital input that can trigger capture of one or more images when external sensors (e.g., the sensors 420, PIR, door/window, etc.) detect motion or other events. In some implementations, the camera 430 receives a command to capture an image when external devices detect motion or another potential alarm event. The camera 430 may receive the command from the controller 412 or directly from one of the sensors 420.

In some examples, the camera 430 triggers integrated or external illuminators (e.g., Infra-Red, Z-wave controlled "white" lights, lights controlled by the property automation controls 422, etc.) to improve image quality when the scene is dark. An integrated or separate light sensor may be used to determine if illumination is desired and may result in increased image quality.

The camera 430 may be programmed with any combination of time/day schedules, system "arming state", or other variables to determine whether images should be captured or not when triggers occur. The camera 430 may enter a low-power mode when not capturing images. In this case, the camera 430 may wake periodically to check for inbound messages from the controller 412. The camera 430 may be powered by internal, replaceable batteries if located remotely from the control unit 410. The camera 430 may employ a small solar cell to recharge the battery when light is available. Alternatively, the camera 430 may be powered by the controller's 412 power supply if the camera 430 is co-located with the controller 412.

In some implementations, the camera 430 communicates directly with the monitoring server 460 over the Internet. In these implementations, image data captured by the camera 430 does not pass through the control unit 410 and the camera 430 receives commands related to operation from the monitoring server 460.

In some implementations, a state of the monitoring system and other events sensed by the monitoring system may be used to enable/disable video/image recording devices (e.g., the camera 430). In these implementations, the camera 430 may be set to capture images on a periodic basis when the alarm system is armed in an "away" state, but set not to capture images when the alarm system is armed in a "home" state or disarmed. In addition, the camera 430 may be triggered to begin capturing images when the alarm system detects an event, such as an alarm event, a door-opening event for a door that leads to an area within a field of view of the camera 430, or motion in the area within the field of view of the camera 430. In other implementations, the camera 430 may capture images continuously, but the captured images may be stored or transmitted over a network when needed.

The system 400 can also include a thermostat 434 to perform dynamic environmental control at the property. The thermostat 434 is configured to monitor temperature and/or energy consumption of an HVAC system associated with the thermostat 434, and is further configured to provide control of environmental (e.g., temperature) settings. In some implementations, the thermostat 434 can additionally or alternatively receive data relating to activity at a property and/or environmental data at a property, e.g., at various locations indoors and outdoors at the property. The thermostat 434 can directly measure energy consumption of the HVAC system associated with the thermostat, or can estimate energy consumption of the HVAC system associated with the thermostat 434, for example, based on detected usage of one or more components of the HVAC system associated with the thermostat 434. The thermostat 434 can communicate temperature and/or energy monitoring information to or from the control unit 410 and can control the environmental (e.g., temperature) settings based on commands received from the control unit 410.

In some implementations, the thermostat 434 is a dynamically programmable thermostat and can be integrated with the control unit 410. For example, the dynamically programmable thermostat 434 can include the control unit 410, e.g., as an internal component to the dynamically programmable thermostat 434. In addition, the control unit 410 can be a gateway device that communicates with the dynamically programmable thermostat 434. In some implementations, the thermostat 434 is controlled via one or more property automation controls 422.

In some examples, a module 437 is connected to one or more components of an HVAC system associated with a property and is configured to control operation of the one or more components of the HVAC system. In some implementations, the module 437 is also configured to monitor energy consumption of the HVAC system components, for example, by directly measuring the energy consumption of the HVAC system components or by estimating the energy usage of the one or more HVAC system components based on detecting usage of components of the HVAC system. The module 437 can communicate energy monitoring information and the state of the HVAC system components to the thermostat 434 and can control the one or more components of the HVAC system based on commands received from the thermostat 434.

The system 400 also includes, or connects to, an electric power distribution system that provides power to locations throughout the property. The distribution system can include one or more electric panels 416. The electrical panels 416 can be, for example, electric breaker panels, panel boards, distribution boards, breaker boxes, or other components that distribute mains power delivered to the property to one or more circuits of the property. The circuits can be configured in any combination of parallel and/or series networks, where each circuit may provide power to one or more receptacles or other terminals. Typically, different circuits may provide power to different areas of the property. For example, one circuit may provide power to one floor of a home, a second circuit may provide power to a second floor of a home, and a third circuit may provide power to a garage of a home. In some cases, more than one circuit may provide power to the same area of the property. Generally, appliances, equipment, sensors, and other electronic devices can be powered by connecting to a receptacle or terminal of a circuit.

The electrical panels 416 can include or connect to one or more breakers 411 or other switches 413 for interrupting power to the one or more circuits. For example, an electrical panel 416 can include one breaker 411 for each circuit, where power can flow through the circuit when the breaker is closed, but power is unable to flow through the circuit when the breaker 411 is open. The breaker 411 can be configured to automatically open (e.g., to interrupt power flow through a circuit) if a particular fault condition is detected, for example, if an overload condition is detected for the circuit. The breakers 411 can be mechanical or electrical switches. In some examples, the breakers 411 can be remote-controlled (e.g., the state of the breaker 411 can be changed via a received signal).

In some implementations, one or more switches 413 may control power delivery to one or more receptacles or other terminals of a circuit. For example, a switch 413 may open or close to interrupt or allow, respectively, power delivery to one or more receptacles, outlets, or other terminals. The switches 413 can be mechanical, electrical, magnetic, or any other switch technology. In some implementations, the switches 413 can be remote-controlled.

The electrical panels 416, or components of the electrical panels 416, communicate with the control unit 410, possibly through the network 405. For example, an electrical panel 416 may include a transceiver module which allows the panel 416 to exchange electronic data over the network 405 via a wireless protocol such as Z-wave, Zigbee, Bluetooth, Bluetooth LE, or another wireless data transfer protocol. In some examples, one or more of the electrical panels 416 may communicate with the network 405 via a wired connection.

In some implementations, one or more of the receptacles connected to the circuits may be smart receptacles that include electronic hardware and/or software providing functionality beyond powering a connected device. For example, the smart receptacle may be able to sense when it is powered (e.g., when the circuit it is connected to can deliver electric current) or when an appliance or other device is connected to it and drawing power. In some implementations, the smart receptacle may include one or more LEDs, LCDs, screens, or other displays to visualize information related to the receptacle. For example, the smart receptacle may light an LED of a particular color to indicate the circuit to which it is connected (e.g., different colored lights indicate connection to different circuits) or the receptacle may display on a screen a number indicating the circuit to which it is connected. In some examples, the smart receptacle may include a transmitter and/or a receiver for exchanging electronic data with other devices. For example, the smart receptacle may exchange data with the electrical panel 416 or the control unit 410 through the network 405.

In some examples, the electrical panels 416 send information related to the electric power distribution system to the control unit 410. For example, a panel 416 can send information related to the status of a circuit (e.g., powered or not powered), the state of a breaker (e.g., open or closed), the instantaneous, average, or historical voltage level, current draw, load level or power delivered by one or more circuits, or other data related to the distribution system.

The control unit 410 or another device can also send instructions to the electrical panels 416. For example, the control unit 410 can send an instruction for a panel 416 to change a state of a breaker, to interrupt power to a circuit, to take a measurement of voltage, current, or power, or to perform another operation.

In some examples, the system 400 further includes one or more robotic devices 490. The robotic devices 490 may be any type of robots that are capable of moving and taking actions that assist in property monitoring. For example, the robotic devices 490 may include drones that are capable of moving throughout a property based on automated control technology and/or user input control provided by a user. In this example, the drones may be able to fly, roll, walk, or otherwise move about the property. The drones may include helicopter type devices (e.g., quad copters), rolling helicopter type devices (e.g., roller copter devices that can fly and also roll along the ground, walls, or ceiling) and land vehicle type devices (e.g., automated cars that drive around a property). In some cases, the robotic devices 490 may be robotic devices 490 that are intended for other purposes and merely associated with the system 400 for use in appropriate circumstances. For instance, a robotic vacuum cleaner device may be associated with the monitoring system 400 as one of the robotic devices 490 and may be controlled to take action responsive to monitoring system events.

In some examples, the robotic devices 490 automatically navigate within a property. In these examples, the robotic devices 490 include sensors and control processors that guide movement of the robotic devices 490 within the property. For instance, the robotic devices 490 may navigate within the property using one or more cameras, one or more proximity sensors, one or more gyroscopes, one or more accelerometers, one or more magnetometers, a global positioning system (GPS) unit, an altimeter, one or more sonar or laser sensors, and/or any other types of sensors that aid in navigation about a space. The robotic devices 490 may include control processors that process output from the various sensors and control the robotic devices 490 to move along a path that reaches the desired destination and avoids obstacles. In this regard, the control processors detect walls or other obstacles at the property and guide movement of the robotic devices 490 in a manner that avoids the walls and other obstacles.

In addition, the robotic devices 490 may store data that describes attributes of the property. For instance, the robotic devices 490 may store a floorplan and/or a three-dimensional model of the property that enables the robotic devices 490 to navigate the property. During initial configuration, the robotic devices 490 may receive the data describing attributes of the property, determine a frame of reference to the data (e.g., a property or reference location at the property), and navigate the property based on the frame of reference and the data describing attributes of the property. Further, initial configuration of the robotic devices 490 also may include learning of one or more navigation patterns in which a user provides input to control the robotic devices 490 to perform a specific navigation action (e.g., fly to an upstairs bedroom and spin around while capturing video and then return to a property charging base). In this regard, the robotic devices 490 may learn and store the navigation patterns such that the robotic devices 490 may automatically repeat the specific navigation actions upon a later request.

In some examples, the robotic devices 490 may include data capture and recording devices. In these examples, the robotic devices 490 may include one or more cameras, one or more motion sensors, one or more microphones, one or more biometric data collection tools, one or more temperature sensors, one or more humidity sensors, one or more air flow sensors, and/or any other types of sensors that may be useful in capturing monitoring data related to the property and users at the property. The one or more biometric data collection tools may be configured to collect biometric samples of a person at the property with or without contact of the person. For instance, the biometric data collection tools may include a fingerprint scanner, a hair sample collection tool, a skin cell collection tool, and/or any other tool that allows the robotic devices 490 to take and store a biometric sample that can be used to identify the person (e.g., a biometric sample with DNA that can be used for DNA testing).

In some implementations, the robotic devices 490 may include output devices. In these implementations, the robotic devices 490 may include one or more displays, one or more speakers, and/or any type of output devices that allow the robotic devices 490 to communicate information to a nearby user.

The robotic devices 490 also may include a communication module that enables the robotic devices 490 to communicate with the control unit 410, each other, and/or other devices. The communication module may be a wireless communication module that allows the robotic devices 490 to communicate wirelessly. For instance, the communication module may be a Wi-Fi module that enables the robotic devices 490 to communicate over a local wireless network at the property. The communication module further may be a 900 MHz wireless communication module that enables the robotic devices 490 to communicate directly with the control unit 410. Other types of short-range wireless communication protocols, such as Bluetooth, Bluetooth LE, Z-wave, Zigbee, etc., may be used to allow the robotic devices 490 to communicate with other devices at the property.

The robotic devices 490 further may include processor and storage capabilities. The robotic devices 490 may include any suitable processing devices that enable the robotic devices 490 to operate applications and perform the actions described throughout this disclosure. In addition, the robotic devices 490 may include solid state electronic storage that enables the robotic devices 490 to store applications, configuration data, collected sensor data, and/or any other type of information available to the robotic devices 490.

The robotic devices 490 are associated with one or more charging stations. The charging stations may be located at predefined home base or reference locations at the property. The robotic devices 490 may be configured to navigate to the charging stations after completion of tasks needed to be performed for the monitoring system 400. For instance, after completion of a monitoring operation or upon instruction by the control unit 410, the robotic devices 490 may be configured to automatically fly to and land on one of the charging stations. In this regard, the robotic devices 490 may automatically maintain a fully charged battery in a state in which the robotic devices 490 are ready for use by the monitoring system 400.

The charging stations may be contact based charging stations and/or wireless charging stations. For contact based charging stations, the robotic devices 490 may have readily accessible points of contact that the robotic devices 490 are capable of positioning and mating with a corresponding contact on the charging station. For instance, a helicopter type robotic device may have an electronic contact on a portion of its landing gear that rests on and mates with an electronic pad of a charging station when the helicopter type robotic device lands on the charging station. The electronic contact on the robotic device may include a cover that opens to expose the electronic contact when the robotic device is charging and closes to cover and insulate the electronic contact when the robotic device is in operation.

For wireless charging stations, the robotic devices 490 may charge through a wireless exchange of power. In these cases, the robotic devices 490 need only locate themselves closely enough to the wireless charging stations for the wireless exchange of power to occur. In this regard, the positioning needed to land at a predefined home base or reference location at the property may be less precise than with a contact based charging station. Based on the robotic devices 490 landing at a wireless charging station, the wireless charging station outputs a wireless signal that the robotic devices 490 receive and convert to a power signal that charges a battery maintained on the robotic devices 490.

In some implementations, each of the robotic devices 490 has a corresponding and assigned charging station such that the number of robotic devices 490 equals the number of charging stations. In these implementations, the robotic devices 490 always navigate to the specific charging station assigned to that robotic device. For instance, a first robotic device may always use a first charging station and a second robotic device may always use a second charging station.

In some examples, the robotic devices 490 may share charging stations. For instance, the robotic devices 490 may use one or more community charging stations that are capable of charging multiple robotic devices 490. The community charging station may be configured to charge multiple robotic devices 490 in parallel. The community charging station may be configured to charge multiple robotic devices 490 in serial such that the multiple robotic devices 490 take turns charging and, when fully charged, return to a predefined home base or reference location at the property that is not associated with a charger. The number of community charging stations may be less than the number of robotic devices 490.

Also, the charging stations may not be assigned to specific robotic devices 490 and may be capable of charging any of the robotic devices 490. In this regard, the robotic devices 490 may use any suitable, unoccupied charging station when not in use. For instance, when one of the robotic devices 490 has completed an operation or is in need of battery charge, the control unit 410 references a stored table of the occupancy status of each charging station and instructs the robotic device to navigate to the nearest charging station that is unoccupied.

The system 400 further includes one or more integrated security devices 480. The one or more integrated security devices 480 may include any type of device used to provide alerts based on received sensor data. For instance, the control unit 410 may provide one or more alerts to the security input/output devices 480. Additionally, the control unit 410 may receive sensor data from the one or more sensors 420 and determine whether to provide an alert to the integrated security input/output devices 480.

The sensors 420, the property automation controls 422, the camera 430, the thermostat 434, and the integrated security devices 480 may communicate with the controller 412 over communication links 424, 426, 428, 432, and 484. The communication links 424, 426, 428, 432, and 484 may be a wired or wireless data pathway configured to transmit signals from the sensors 420, the property automation controls 422, the camera 430, the thermostat 434, and the integrated security devices 480 to the controller 412. The sensors 420, the property automation controls 422, the camera 430, the thermostat 434, and the integrated security devices 480 may continuously transmit sensed values to the controller 412, periodically transmit sensed values to the controller 412, or transmit sensed values to the controller 412 in response to a change in a sensed value.

The communication links 424, 426, 428, 432, and 484 may include a local network. The sensors 420, the property automation controls 422, the camera 430, the thermostat 434, and the integrated security devices 480, and the controller 412 may exchange data and commands over the local network. The local network may include 802.11 "Wi-Fi" wireless Ethernet (e.g., using low-power Wi-Fi chipsets), Z-Wave, Zigbee, Bluetooth, "Homeplug" or other "Powerline" networks that operate over AC wiring, and a Category 5 (CAT5) or Category 5 (CAT6) wired Ethernet network. The local network may be a mesh network constructed based on the devices connected to the network.

The monitoring server 460 is an electronic device configured to provide monitoring services by exchanging electronic communications with the control unit 410, the one or more user devices 440 and 450, and a central alarm station server 470 over the network 405. For example, the monitoring server 460 may be configured to monitor events (e.g., alarm events) generated by the control unit 410. In this example, the monitoring server 460 may exchange electronic communications with the network module 414 included in the control unit 410 to receive information regarding events (e.g., alerts) detected by the control unit 410. The monitoring server 460 also may receive information regarding events (e.g., alerts) from the one or more user devices 440 and 450. The monitoring server 460 can be one or more computer systems or server systems. In some implementations, the monitoring server 460 is a cloud computing platform.

In some examples, the monitoring server 460 may route alert data received from the network module 414 or the one or more user devices 440 and 450 to the central alarm station server 470. For example, the monitoring server 460 may transmit the alert data to the central alarm station server 470 over the network 405.

The monitoring server 460 may store sensor and image data received from the monitoring system and perform analysis of sensor and image data received from the monitoring system. Based on the analysis, the monitoring server 460 may communicate with and control aspects of the control unit 410 or the one or more user devices 440 and 450.

The monitoring server 460 may provide various monitoring services to the system 400. For example, the monitoring server 460 may analyze the sensor, image, and other data to determine an activity pattern of an occupant of the property monitored by the system 400. In some implementations, the monitoring server 460 may analyze the data for alarm conditions or may determine and perform actions at the property by issuing commands to one or more of the controls 422, possibly through the control unit 410.

The central alarm station server 470 is an electronic device configured to provide alarm monitoring service by exchanging communications with the control unit 410, the one or more mobile devices 440 and 450, and the monitoring server 460 over the network 405. For example, the central alarm station server 470 may be configured to monitor alerting events generated by the control unit 410. In this example, the central alarm station server 470 may exchange communications with the network module 414 included in the control unit 410 to receive information regarding alerting events detected by the control unit 410. The central alarm station server 470 also may receive information regarding alerting events from the one or more mobile devices 440 and 450 and/or the monitoring server 460.

The central alarm station server 470 is connected to multiple terminals 472 and 474. The terminals 472 and 474 may be used by operators to process alerting events. For example, the central alarm station server 470 may route alerting data to the terminals 472 and 474 to enable an operator to process the alerting data. The terminals 472 and 474 may include general-purpose computers (e.g., desktop personal computers, workstations, or laptop computers) that are configured to receive alerting data from a server in the central alarm station server 470 and render a display of information based on the alerting data. For instance, the controller 412 may control the network module 414 to transmit, to the central alarm station server 470, alerting data indicating that a sensor 420 detected motion from a motion sensor via the sensors 420. The central alarm station server 470 may receive the alerting data and route the alerting data to the terminal 472 for processing by an operator associated with the terminal 472. The terminal 472 may render a display to the operator that includes information associated with the alerting event (e.g., the lock sensor data, the motion sensor data, the contact sensor data, etc.) and the operator may handle the alerting event based on the displayed information. In some implementations, the terminals 472 and 474 may be mobile devices or devices designed for a specific function. Although FIG. 4 illustrates two terminals for brevity, actual implementations may include more (and, perhaps, many more) terminals.

The one or more authorized user devices 440 and 450 are devices that host and display user interfaces. For instance, the user device 440 is a mobile device that hosts or runs one or more native applications (e.g., the smart home application 442). The user device 440 may be a cellular phone or a non-cellular locally networked device with a display. The user device 440 may include a cell phone, a smart phone, a tablet PC, a personal digital assistant ("PDA"), or any other portable device configured to communicate over a network and display information. For example, implementations may also include Blackberry-type devices (e.g., as provided by Research in Motion), electronic organizers, iPhone-type devices (e.g., as provided by Apple), iPod devices (e.g., as provided by Apple) or other portable music players, other communication devices, and handheld or portable electronic devices for gaming, communications, and/or data organization. In some examples, the user device 440 can be an electronic home assistant, a smart speaker, or another computing device capable of receiving and responding to voice commands. The user device 440 may perform functions unrelated to the monitoring system, such as placing personal telephone calls, playing music, playing video, displaying pictures, browsing the Internet, maintaining an electronic calendar, etc.

The user device 440 includes a smart home application 442. The smart home application 442 refers to a software/ firmware program running on the corresponding mobile device that enables the user interface and features described throughout. The user device 440 may load or install the smart home application 442 based on data received over a network or data received from local media. The smart home application 442 runs on mobile devices platforms, such as iPhone, iPod touch, Blackberry, Google Android, Windows Mobile, etc. The smart home application 442 enables the user device 440 to receive and process image and sensor data from the monitoring system.

The user device 450 may be a general-purpose computer (e.g., a desktop personal computer, a workstation, or a laptop computer) that is configured to communicate with the monitoring server 460 and/or the control unit 410 over the network 405. The user device 450 may be configured to display a smart home user interface 452 that is generated by the user device 450 or generated by the monitoring server 460. For example, the user device 450 may be configured to display a user interface (e.g., a web page) provided by the monitoring server 460 that enables a user to perceive images captured by the camera 430 and/or reports related to the monitoring system.

In some implementations, the one or more user devices 440 and 450 communicate with and receive monitoring system data from the control unit 410 using the communication link 438. For instance, the one or more user devices 440 and 450 may communicate with the control unit 410 using various local wireless protocols such as Wi-Fi, Bluetooth, Z-wave, Zigbee, HomePlug (ethernet over power line), or wired protocols such as Ethernet and USB, to connect the one or more user devices 440 and 450 to local security and automation equipment. The one or more user devices 440 and 450 may connect locally to the monitoring system and its sensors and other devices, including the electrical panels 416 of the electric power distribution system. The local connection may improve the speed of status and control communications because communicating through the network 405 with a remote server (e.g., the monitoring server 460) may be significantly slower.

Although the one or more user devices 440 and 450 are shown as communicating with the control unit 410, the one or more user devices 440 and 450 may communicate directly with the sensors and other devices controlled by the control unit 410. In some implementations, the one or more user devices 440 and 450 replace the control unit 410 and perform the functions of the control unit 410 for local monitoring and long range/offsite communication.

In other implementations, the one or more user devices 440 and 450 receive monitoring system data captured by the control unit 410 through the network 405. The one or more user devices 440, 450 may receive the data from the control unit 410 through the network 405 or the monitoring server 460 may relay data received from the control unit 410 to the one or more user devices 440 and 450 through the network 405. In this regard, the monitoring server 460 may facilitate communication between the one or more user devices 440 and 450 and the monitoring system.

In some implementations, the one or more user devices 440 and 450 may be configured to switch whether the one or more user devices 440 and 450 communicate with the control unit 410 directly (e.g., through link 438) or through the monitoring server 460 (e.g., through network 405) based on a location of the one or more user devices 440 and 450. For instance, when the one or more user devices 440 and 450 are located close to the control unit 410 and in range to communicate directly with the control unit 410, the one or more user devices 440 and 450 use direct communication. When the one or more user devices 440 and 450 are located far from the control unit 410 and not in range to communicate directly with the control unit 410, the one or more user devices 440 and 450 use communication through the monitoring server 460.

Although the one or more user devices 440 and 450 are shown as being connected to the network 405, in some implementations, the one or more user devices 440 and 450 are not connected to the network 405. In these implementations, the one or more user devices 440 and 450 communicate directly with one or more of the monitoring system components and no network (e.g., Internet) connection or reliance on remote servers is needed.

In some implementations, the one or more user devices 440 and 450 are used in conjunction with only local sensors and/or local devices in a house. In these implementations, the system 400 may include the one or more user devices 440 and 450, the sensors 420, the property automation controls 422, the camera 430, the robotic devices 490, and the electric panels 416. The one or more user devices 440 and 450 receive data directly from the sensors 420, the property automation controls 422, the camera 430, the robotic devices 490, and the electric panels 416 and send data directly to the sensors 420, the property automation controls 422, the camera 430, the robotic devices 490, and the electric panels 416. The one or more user devices 440, 450 provide the appropriate interfaces/processing to provide visual surveillance, reporting, and device control.

In other implementations, the system 400 further includes network 405 and the sensors 420, the property automation controls 422, the camera 430, the thermostat 434, the robotic devices 490, and the electric panels 416 are configured to communicate sensor and image data to the one or more user devices 440 and 450 over the network 405 (e.g., the Internet, cellular network, etc.). In yet another implementation, the sensors 420, the property automation controls 422, the camera 430, the thermostat 434, the robotic devices 490, and the electric panels 416 (or a component, such as a bridge/router) are intelligent enough to change the communication pathway from a direct local pathway when the one or more user devices 440 and 450 are in close physical proximity to the various devices to a pathway over the network 405 when the one or more user devices 440 and 450 are farther from the various devices. In some examples, the system leverages GPS information from the one or more user devices 440 and 450 to determine whether the one or more user devices 440 and 450 are close enough to the sensors 420, the property automation controls 422, the camera 430, the thermostat 434, the robotic devices 490, and the electric panels 416 to use the direct local pathway or whether the one or more user devices 440 and 450 are far enough from the various devices that the pathway over the network 405 is required. In other examples, the system leverages status communications (e.g., pinging) between the one or more user devices 440 and 450 and the sensors 420, the property automation controls 422, the camera 430, the thermostat 434, the robotic devices 490, and the electric panels 416 to determine whether communication using the direct local pathway is possible. If communication using the direct local pathway is possible, the one or more user devices 440 and 450 communicate with the various devices using the direct local pathway. If communication using the direct local pathway is not possible, the one or more user devices 440 and 450 communicate with the sensors 420, the property automation controls 422, the camera 430, the thermostat 434, the robotic devices 490, and the electric panels 416 using the pathway over the network 405.

In some implementations, the system 400 provides end users with access to sensor or other monitoring system data to aid in decision making. The system 400 may transmit the data over a wireless WAN network to the user devices 440 and 450. Because transmission over a wireless WAN network may be relatively expensive, the system 400 can use several techniques to reduce costs while providing access to significant levels of useful visual information (e.g., compressing data, down-sampling data, sending data only over inexpensive LAN connections, or other techniques).

The described systems, methods, and techniques may be implemented in digital electronic circuitry, computer hardware, firmware, software, or in combinations of these elements. Apparatus implementing these techniques may include appropriate input and output devices, a computer processor, and a computer program product tangibly embodied in a machine-readable storage device for execution by a programmable processor. A process implementing these techniques may be performed by a programmable processor executing a program of instructions to perform desired functions by operating on input data and generating appropriate output. The techniques may be implemented in one or more computer programs that are executable on a programmable system including at least one programmable processor coupled to receive data and instructions from, and to transmit data and instructions to, a data storage system, at least one input device, and at least one output device. Each computer program may be implemented in a high-level procedural or object-oriented programming language, or in assembly or machine language if desired; and in any case, the language may be a compiled or interpreted language. Suitable processors include, by way of example, both general and special purpose microprocessors. Generally, a processor will receive instructions and data from a read-only memory and/or a random access memory. Storage devices suitable for tangibly embodying computer program instructions and data include all forms of non-volatile memory, including by way of example semiconductor memory devices, such as Erasable Programmable Read-Only Memory (EPROM), Electrically Erasable Programmable Read-Only Memory (EEPROM), and flash memory devices; magnetic disks such as internal hard disks and removable disks; magneto-optical disks; and Compact Disc Read-Only Memory (CD-ROM). Any of the foregoing may be supplemented by, or incorporated in, specially designed ASICs (application-specific integrated circuits).

It will be understood that various modifications may be made. For example, other useful implementations could be achieved if steps of the disclosed techniques were performed in a different order and/or if components in the disclosed systems were combined in a different manner and/or replaced or supplemented by other components. Accordingly, other implementations are within the scope of the disclosure.

What is claimed is:

1. A monitoring system that is configured to monitor a property, the monitoring system comprising:
 a sensor that is configured to generate sensor data that reflects an attribute of the property;
 an electrical circuit that is located electrically between a power source and an electrical device and that is configured to pass electrical power from the power source to the electrical device or prevent electrical power from passing from the power source to the electrical device; and
 a monitor control unit that is configured to:
  receive the sensor data;
  based on the sensor data, detect an event at a location of the property;
  based on the detection of the event at the location of the property, determine that the electrical circuit supplies power to the location of the property and determine an arming status of the monitoring system from among options including "home, armed," "home, disarmed," "away, armed," and "away, disarmed;"
  based on the event at the location of the property, the determination that the electrical circuit supplies power to the location of the property, and the determined arming status of the monitoring system, determine a power control operation for the electrical circuit;
  based on the determined power control operation for the electrical circuit, determine to (i) switch the electrical circuit from passing electrical power from the power source to the electrical device to preventing electrical power from passing from the power source to the electrical device or (ii) switch the electrical circuit from preventing electrical power from passing from the power source to the electrical device to passing electrical power from the power source to the electrical device; and
  based on determining to (i) switch the electrical circuit from passing electrical power from the power source to the electrical device to preventing electrical power from passing from the power source to the electrical device or (ii) switch the electrical circuit from preventing electrical power from passing from the power source to the electrical device to passing electrical power from the power source to the elecrical device, switch the electrical circuit from passing electrical power from the power source to the electrical device to preventing electrical power from passing from the power source to the electrical device or switch the electrical circuit from preventing electrical power from passing from the power source to the electrical device to passing electrical power from the power source to the electrical device,
 wherein the electrical circuit comprises a circuit breaker that is part of an electrical panel,
 wherein the electrical circuit is configured to pass electrical power from the power source to the electrical device by closing the circuit breaker,
 wherein the electrical circuit is configured to prevent electrical power from passing from the power source to the electrical device by opening the circuit breaker, and
 wherein the monitor control unit is configured to detect motion at the property, determine the arming status of the monitoring system as "away, armed," detect opening of the circuit breaker to turn off power to an area of the property where motion was detected, and, based on the detection of motion at the property, the determination of the arming status of the monitoring system as "away, armed," the detection of the opening of the circuit breaker to turn off power to the area of the property where motion was detected, send an instruction to the electrical panel to close the circuit breaker to restore power to the area of the property where motion was detected and send a notification to a user device.

2. The monitoring system of claim 1, wherein the monitor control unit is configured to:
 determine that the monitor control unit received a command to switch the electrical circuit,
 wherein determining to (i) switch the electrical circuit from passing electrical power from the power source to the electrical device to preventing electrical power from passing from the power source to the electrical device or (ii) switch the electrical circuit from preventing electrical power from passing from the power source to the electrical device to passing electrical power from the power source to the electrical device is based further on the command to switch the electrical circuit.

3. The monitoring system of claim 1, wherein the monitor control unit is configured to, based on the determined power control operation for the electrical circuit:
generate a notification prompting a resident of the property whether to switch the electrical circuit;
provide, for output, the notification prompting the resident whether to switch the electrical circuit; and
receive, from the resident, a command to switch the electrical circuit,
wherein determining to (i) switch the electrical circuit from passing electrical power from the power source to the electrical device to preventing electrical power from passing from the power source to the electrical device or (ii) switch the electrical circuit from preventing electrical power from passing from the power source to the electrical device to passing electrical power from the power source to the electrical device is based further on the command to switch the electrical circuit.

4. The monitoring system of claim 1, wherein the monitor control unit is configured to:
based on switching the electrical circuit from passing electrical power from the power source to the electrical device to preventing electrical power from passing from the power source to the electrical device or switch the electrical circuit from preventing electrical power from passing from the power source to the electrical device to passing electrical power from the power source to the electrical device, generate a notification indicating that the monitoring system switched the electrical circuit; and
provide, for output, the notification indicating that the monitoring system switched the electrical circuit.

5. The monitoring system of claim 1, wherein the monitor control unit is configured to:
determine to (i) switch the electrical circuit from passing electrical power from the power source to the electrical device to preventing electrical power from passing from the power source to the electrical device or (ii) switch the electrical circuit from preventing electrical power from passing from the power source to the electrical device to passing electrical power from the power source to the electrical device by determining to switch the electrical circuit from passing electrical power from the power source to the electrical device to preventing electrical power from passing from the power source to the electrical device; and
based on determining to switch the electrical circuit from passing electrical power from the power source to the electrical device to preventing electrical power from passing from the power source to the electrical device, switch the electrical circuit from passing electrical power from the power source to the electrical device to preventing electrical power from passing from the power source to the electrical device or switch the electrical circuit from preventing electrical power from passing from the power source to the electrical device to passing electrical power from the power source to the electrical device by switching the electrical circuit from passing electrical power from the power source to the electrical device to preventing electrical power from passing from the power source to the electrical device.

6. The monitoring system of claim 5, wherein:
the sensor is a water sensor that is configured to generate water sensor data that reflects that water is present in a vicinity of the electrical device, and
the monitor control unit is configured to:
determine to switch the electrical circuit from passing electrical power from the power source to the electrical device to preventing electrical power from passing from the power source to the electrical device based on analyzing the water sensor data that reflects that water is present in the vicinity of the electrical device.

7. The monitoring system of claim 5, wherein:
the sensor is a smoke detector that is configured to generate smoke detector data that reflects that smoke is present in a vicinity of the electrical device, and
the monitor control unit is configured to:
determine to switch the electrical circuit from passing electrical power from the power source to the electrical device to preventing electrical power from passing from the power source to the electrical device based on analyzing the smoke detector data that reflects that smoke is present in the vicinity of the electrical device.

8. The monitoring system of claim 1, wherein the monitor control unit is configured to:
determine to (i) switch the electrical circuit from passing electrical power from the power source to the electrical device to preventing electrical power from passing from the power source to the electrical device or (ii) switch the electrical circuit from preventing electrical power from passing from the power source to the electrical device to passing electrical power from the power source to the electrical device by determining to switch the electrical circuit from preventing electrical power from passing from the power source to the electrical device to passing electrical power from the power source to the electrical device; and
based on determining to switch the electrical circuit from preventing electrical power from passing from the power source to the electrical device to passing electrical power from the power source to the electrical device, switch the electrical circuit from passing electrical power from the power source to the electrical device to preventing electrical power from passing from the power source to the electrical device or switch the electrical circuit from preventing electrical power from passing from the power source to the electrical device to passing electrical power from the power source to the electrical device by switching the electrical circuit from preventing electrical power from passing from the power source to the electrical device to passing electrical power from the power source to the electrical device.

9. The monitoring system of claim 1, wherein the power control operation for the electrical circuit is different based on the arming status of the monitoring system being "home, armed" as compared to "away, armed".

10. A computer-implemented method, comprising:
receiving, from a sensor of a monitoring system that is configured to monitor a property, sensor data;
based on the sensor data, detecting, by the monitoring system, an event at a location of the property;

based on the detection of the event at the location of the property, determining, by the monitoring system, that the electrical circuit supplies power to the location of the property and determining, by the monitoring system, an arming status of the monitoring system from among options including "home, armed," "home, disarmed," "away, armed," and "away, disarmed;"

based on the event at the location of the property, the determination that the electrical circuit supplies power to the location of the property, and the determined arming status of the monitoring system, determining, by the monitoring system, a power control operation for the electrical circuit;

based on the determined power control operation for the electrical circuit, determining, by the monitoring system, to (i) switch an electrical circuit from passing electrical power from a power source to an electrical device to preventing electrical power from passing from the power source to the electrical device or (ii) switch the electrical circuit from preventing electrical power from passing from the power source to the electrical device to passing electrical power from the power source to the electrical device, wherein the electrical circuit is located electrically between the power source and the electrical device and is configured to pass electrical power from the power source to the electrical device or prevent electrical power from passing from the power source to the electrical device; and based on determining to (i) switch the electrical circuit from passing electrical power from the power source to the electrical device to preventing electrical power from passing from the power source to the electrical device or (ii) switch the electrical circuit from preventing electrical power from passing from the power source to the electrical device to passing electrical power from the power source to the electrical device, switching, by the monitoring system, the electrical circuit from passing electrical power from the power source to the electrical device to preventing electrical power from passing from the power source to the electrical device or switching, by the monitoring system, the electrical circuit from preventing electrical power from passing from the power source to the electrical device to passing electrical power from the power source to the electrical device, wherein the electrical circuit comprises a circuit breaker that is part of an electrical panel, wherein the electrical circuit is configured to pass electrical power from the power source to the electrical device by closing the circuit breaker, wherein the electrical circuit is configured to prevent electrical power from passing from the power source to the electrical device by opening the circuit breaker, and wherein the method further comprises:
 detecting motion at the property,
 determining the arming status of the monitoring system as "away, armed,"
 detecting opening of the circuit breaker to turn off power to an area of the property where motion was detected, and
 based on the detection of motion at the property, the determination of the arming status of the monitoring system as "away, armed," the detection of the opening of the circuit breaker to turn off power to the area of the property where motion was detected, sending an instruction to the electrical panel to close the circuit breaker to restore power to the area of the property where motion was detected and sending a notification to a user device.

11. The method of claim 10, comprising:
determining, by the monitoring system, that the monitoring system received a command to switch the electrical circuit,
wherein determining to (i) switch the electrical circuit from passing electrical power from the power source to the electrical device to preventing electrical power from passing from the power source to the electrical device or (ii) switch the electrical circuit from preventing electrical power from passing from the power source to the electrical device to passing electrical power from the power source to the electrical device is based further on the command to switch the electrical circuit.

12. The method of claim 10, comprising:
generating, by the monitoring system, a notification prompting a resident of the property whether to switch the electrical circuit;
providing, for output by the monitoring system, the notification prompting the resident whether to switch the electrical circuit; and
receiving, from the resident and by the monitoring system, a command to switch the electrical circuit,
wherein determining to (i) switch the electrical circuit from passing electrical power from the power source to the electrical device to preventing electrical power from passing from the power source to the electrical device or (ii) switch the electrical circuit from preventing electrical power from passing from the power source to the electrical device to passing electrical power from the power source to the electrical device is based further on the command to switch the electrical circuit.

13. The method of claim 10, comprising:
based on switching the electrical circuit from passing electrical power from the power source to the electrical device to preventing electrical power from passing from the power source to the electrical device or switch the electrical circuit from preventing electrical power from passing from the power source to the electrical device to passing electrical power from the power source to the electrical device, generating, by the monitoring system, a notification indicating that the monitoring system switched the electrical circuit;
providing, for output by the monitoring system, the notification indicating that the monitoring system switched the electrical circuit.

14. The method of claim 10, comprising:
determining to (i) switch the electrical circuit from passing electrical power from the power source to the electrical device to preventing electrical power from passing from the power source to the electrical device or (ii) switch the electrical circuit from preventing electrical power from passing from the power source to the electrical device to passing electrical power from the power source to the electrical device by determining to switch the electrical circuit from passing electrical power from the power source to the electrical device to preventing electrical power from passing from the power source to the electrical device; and
based on determining to switch the electrical circuit from passing electrical power from the power source to the electrical device to preventing electrical power from passing from the power source to the electrical device, switching the electrical circuit from passing electrical power from the power source to the electrical device to preventing electrical power from passing from the power source to the electrical device or switching the electrical circuit from preventing electrical power from passing from the power source to the electrical device to passing electrical power from the power source to the electrical device by switching the electrical circuit from passing electrical power from the power source to the electrical device to preventing electrical power from passing from the power source to the electrical device.

15. The method of claim 14, wherein:
the sensor is a water sensor that is configured to generate water sensor data that reflects that water is present in a vicinity of the electrical device, and
the method comprises:
determining, by the monitoring system, to switch the electrical circuit from passing electrical power from the power source to the electrical device to preventing electrical power from passing from the power source to the electrical device based on analyzing the water sensor data that reflects that water is present in the vicinity of the electrical device.

16. The method of claim 14, wherein:
the sensor is a smoke detector that is configured to generate smoke detector data that reflects that smoke is present in a vicinity of the electrical device, and
the method comprises:
determining, by the monitoring system, to switch the electrical circuit from passing electrical power from the power source to the electrical device to preventing electrical power from passing from the power source to the electrical device based on analyzing the smoke detector data that reflects that smoke is present in the vicinity of the electrical device.

17. The method of claim 10, comprising:
determining to (i) switch the electrical circuit from passing electrical power from the power source to the electrical device to preventing electrical power from passing from the power source to the electrical device or (ii) switch the electrical circuit from preventing electrical power from passing from the power source to the electrical device to passing electrical power from the power source to the electrical device by determining to switch the electrical circuit from preventing electrical power from passing from the power source to the electrical device to passing electrical power from the power source to the electrical device; and
based on determining to switch the electrical circuit from preventing electrical power from passing from the power source to the electrical device to passing electrical power from the power source to the electrical device, switch the electrical circuit from passing electrical power from the power source to the electrical device to preventing electrical power from passing from the power source to the electrical device or switch the electrical circuit from preventing electrical power from passing from the power source to the electrical device to passing electrical power from the power source to the electrical device by switching the electrical circuit from preventing electrical power from passing from the power source to the electrical device to passing electrical power from the power source to the electrical device.

18. A monitoring system that is configured to monitor a property, the monitoring system comprising:
a sensor that is configured to generate sensor data that reflects an attribute of the property;
an electrical circuit that is located electrically between a power source and an electrical device and that is configured to pass electrical power from the power source to the electrical device or prevent electrical power from passing from the power source to the electrical device; and
a monitor control unit that is configured to:
receive the sensor data;
based on the sensor data, detect an event at a location of the property;
based on the detection of the event at the location of the property, determine that the electrical circuit supplies power to the location of the property and determine an arming status of the monitoring system from among options including "home, armed," "home, disarmed," "away, armed," and "away, disarmed,"
based on the event at the location of the property, the determination that the electrical circuit supplies power to the location of the property, and the determined arming status of the monitoring system, determine a power control operation for the electrical circuit;
based on the determined power control operation for the electrical circuit, determine to (i) switch the electrical circuit from passing electrical power from the power source to the electrical device to preventing electrical power from passing from the power source to the electrical device or (ii) switch the electrical circuit from preventing electrical power from passing from the power source to the electrical device to passing electrical power from the power source to the electrical device; and
based on determining to (i) switch the electrical circuit from passing electrical power from the power source to the electrical device to preventing electrical power from passing from the power source to the electrical device or (ii) switch the electrical circuit from preventing electrical power from passing from the power source to the electrical device to passing electrical power from the power source to the electrical device, switch the electrical circuit from passing electrical power from the power source to the electrical device to preventing electrical power from passing from the power source to the electrical device or switch the electrical circuit from preventing electrical power from passing from the power source to the electrical device to passing electrical power from the power source to the electrical device,
wherein the electrical circuit comprises a circuit breaker that is part of an electrical panel,
wherein the electrical circuit is configured to pass electrical power from the power source to the electrical device by closing the circuit breaker,
wherein the electrical circuit is configured to prevent electrical power from passing from the power source to the electrical device by opening the circuit breaker, and
wherein the electrical circuit is part of a power distribution system that includes multiple circuit breakers in the electrical panel and multiple smart receptacles, wherein the monitor control unit is configured to automatically create a map of the power distribution system by repetitively turning off individual circuit breakers within the electrical panel, determining which of the smart receptacles are not powered, and associating unpowered smart receptacles with an open circuit breaker, and wherein the monitor control unit is configured to store the automatically created map for later use or display.

\* \* \* \* \*